US012575114B2

(12) United States Patent　　　　　(10) Patent No.:　US 12,575,114 B2
Lee et al.　　　　　　　　　　　　　　(45) Date of Patent:　　Mar. 10, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Hengyuan Lee, Hsinchu County (TW); Xinyu Bao, Fremont, CA (US)

(73) Assignee: Taiwan Semiconductor Manufacturing Company. Ltd., Hsinchu (TW)

( * ) Notice: Subject to any disclaimer, the term of this patent is extended or adjusted under 35 U.S.C. 154(b) by 595 days.

(21) Appl. No.: 18/171,283

(22) Filed: Feb. 17, 2023

(65) Prior Publication Data

US 2024/0284682 A1　　Aug. 22, 2024

(51) Int. Cl.
　　*H10B 63/00*　　　　(2023.01)
(52) U.S. Cl.
　　CPC ............. *H10B 63/34* (2023.02); *H10B 63/84* (2023.02)

(58) Field of Classification Search
CPC ........ H10B 51/20; H10B 63/00; H10B 63/34; H10B 63/84; H10B 80/00; H10N 70/00; H10N 70/20; H10N 70/823; H10N 70/8833

See application file for complete search history.

(56) References Cited

U.S. PATENT DOCUMENTS

2015/0008508 A1*　1/2015　Ko ........................ H10D 64/685
　　　　　　　　　　　　　　　　　　　438/591
2023/0078700 A1*　3/2023　Lu ....................... H10D 84/0193
　　　　　　　　　　　　　　　　　　　257/369

* cited by examiner

*Primary Examiner* — Brook Kebede
(74) *Attorney, Agent, or Firm* — JCIPRNET

(57)　　　　　　　ABSTRACT
A semiconductor device includes a first conductive line, a second conductive line, a third conductive line, a first semiconductor layer, a memory layer and a conductive layer. The first conductive line and the second conductive line extend along a first direction. The third conductive line extends along a second direction substantially perpendicular to the first direction. The first semiconductor layer extends along the second direction to surround the third conductive line. The memory layer is disposed between the first semiconductor layer and the second conductive line. The conductive layer is disposed between the memory layer and the first semiconductor layer.

20 Claims, 39 Drawing Sheets

I'

I 202
208
206
204
202
208
206
204
202

200

D1
D2
D3

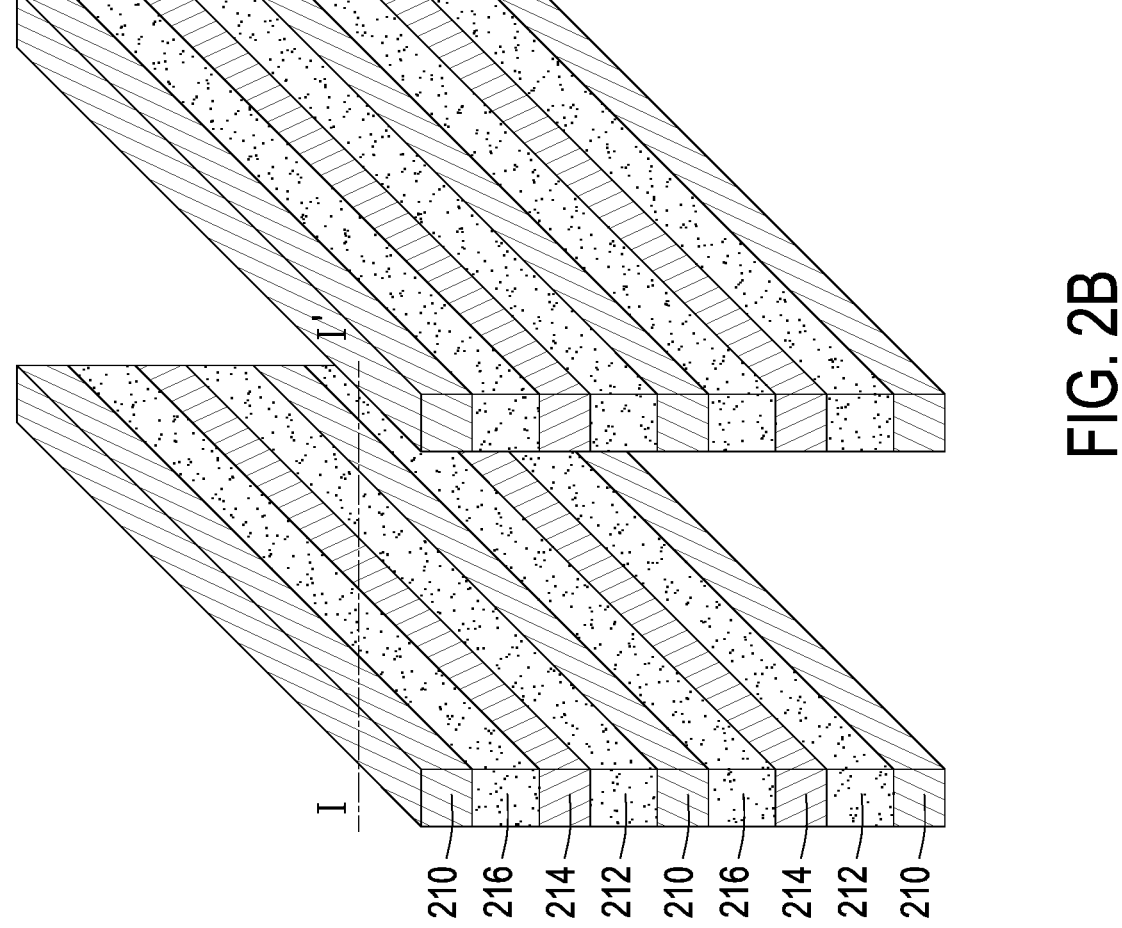
210 216 214 212 210 216 214 212 210
FIG. 2B
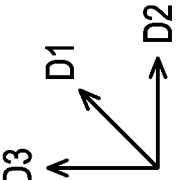
D1
D2
D3

210
216
214
212
210
216
214
212
210

228

D1
D2
D3

SEMICONDUCTOR DEVICE AND METHOD OF FORMING THE SAME

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
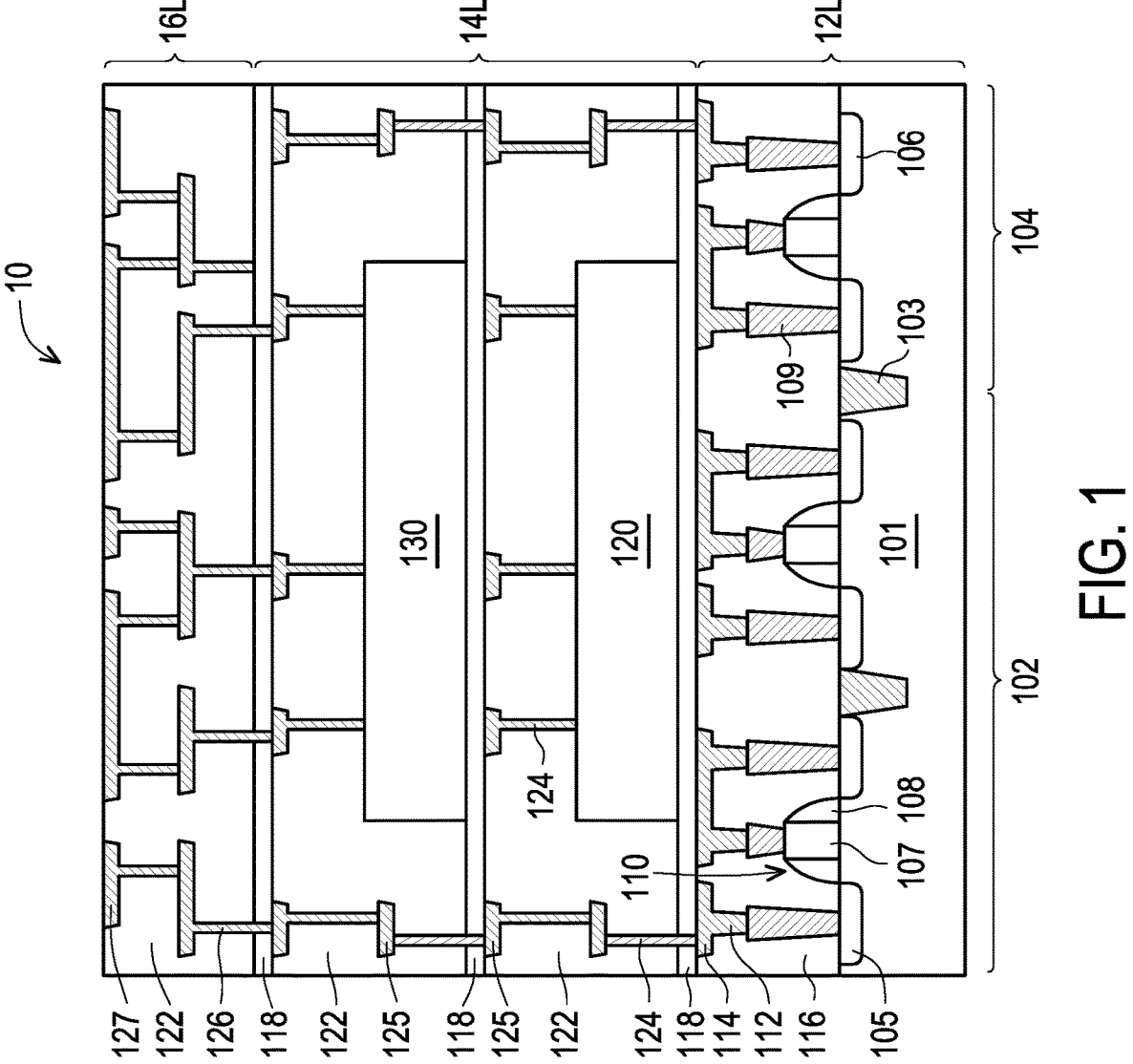
FIG. 1 illustrates a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor device 10 in accordance with some embodiments. In some embodiments, the semiconductor device 10 is formed with integrated memory devices 120 and 130. The semiconductor device 10 may include active devices 110 and memory devices 120, 130. The active devices 110 may be field effect transistor (FET) devices. In one embodiment, the active devices 110 are formed through the front-end-of-line (FEOL) manufacturing processes and include fin field effect transistors (FinFETs). The at least one of the memory devices 120, 130 may be formed through the back-end-of-line (BEOL) manufacturing processes. It is understood that FinFETs are used as examples, and other kinds of FEOL devices such as planar transistors or gate-all-around (GAA) transistors may be used herein and included within the scope of the present disclosure. That is, the memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 includes a first region 102 for forming logic circuits and a second region 104 for forming peripheral circuits, input/output (I/O) circuits, electrostatic discharge (ESD) circuits, and/or analog circuits. The semiconductor device 10 may also include other regions for forming other types of circuits which are fully intended to be included within the scope of the present disclosure. The semiconductor device 10 includes a substrate 101. In some embodiments, the substrate 101 is a bulk substrate, such as a silicon substrate, doped or undoped, or an active layer of a semiconductor-on-insulator (SOI) substrate. In some embodiments, the substrate 101 includes other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Other substrates, such as multi-layered or gradient substrates, may also be used. For example, additional electrical components, such as resistors, capacitors, inductors, diodes, or the like, is formed in or on the substrate 101 during the FEOL manufacturing processes.

As seen in FIG. 1, the active devices 110 are formed on the substrate 101, and isolation regions 103, such as shallow trench isolation (STI) regions, are formed between or around the active devices 110. In some embodiments, the active device 110 includes a gate electrode 107 and source and drain regions 105 and 106. The gate electrode 107 may be formed over the substrate 101 with gate spacers 108 along sidewalls of the gate electrode 107. The source and drain regions 105 and 106 such as doped or epitaxial source and drain regions are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source and drain regions 105 and 106). In some embodiments, a dielectric layer 116, such as an inter-layer dielectric (ILD) layer, is formed over the substrate 101 and covering the source and drain regions 105 and 106, the gate electrode 107 and the contacts 109, and other electrically conductive features, such as conductive interconnect structures including conductive vias 112 and conductive lines 114, are embedded in the dielectric layer 116. It is understood that the dielectric layer 116 may include more than one dielectric layers of the same or different dielectric materials. Collectively, the substrate 101, the active devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 includes an etch stop layer (ESL). In some embodiments, the materials of the dielectric layers 118 is different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 is omitted. In some embodiments, the dielectric layers 116 and 122 is formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layer 122 and coupled to electrically conductive features (e.g., conductive vias 124 and conductive lines 125) in the dielectric layer 122.

In FIG. 1, the memory devices 120 and 130 are formed at different layers of the dielectric layers 122. The memory device 120 is formed at the lower layer, and the memory device 130 is formed at the upper layer. In some embodiments, the memory devices 120 and 130 have the same or similar structure. In some embodiments, the memory devices 120 and 130 have different structure designs. Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed in the BEOL processes of semiconductor manufacturing. The memory devices 120 and 130 may be formed in the BEOL processes at any suitable locations within the semiconductor device 10, such as over the first region 102, over the second region 104, or over a plurality of regions.

After the memory device level 14L is formed, an interconnect level 16L including electrically conductive interconnecting features (e.g., conductive vias 126 and conductive lines 127) embedded in the dielectric layer(s) 122 is formed over the memory device level 14L. Any suitable methods may be employed to form the interconnect level 16L, and the details are not described herein. In some embodiments, the interconnect level 16L is electrically connect the electrical components formed in/on the substrate 101 to form functional circuits. In some embodiments, the interconnect structure 16L is also electrically coupled the memory devices 120, 130 to the active devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the active devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

FIG. 2A to FIG. 3H illustrate varying views of a method of forming a memory device in accordance with some embodiments. FIG. 2A to FIG. 2G illustrate three dimensional views of stages of forming a memory device. FIG. 3A to FIG. 3H illustrate cross-sectional views taken along lines I-I' of FIG. 2A to FIG. 2G. FIG. 4 is a circuit diagram of a memory device of FIG. 2G. According to some embodiments, the memory device may be a three-dimensional (3D) memory device. The memory devices depicted in the following paragraphs may be used as the memory devices 120 and 130 in FIG. 1.

Figure 2A:
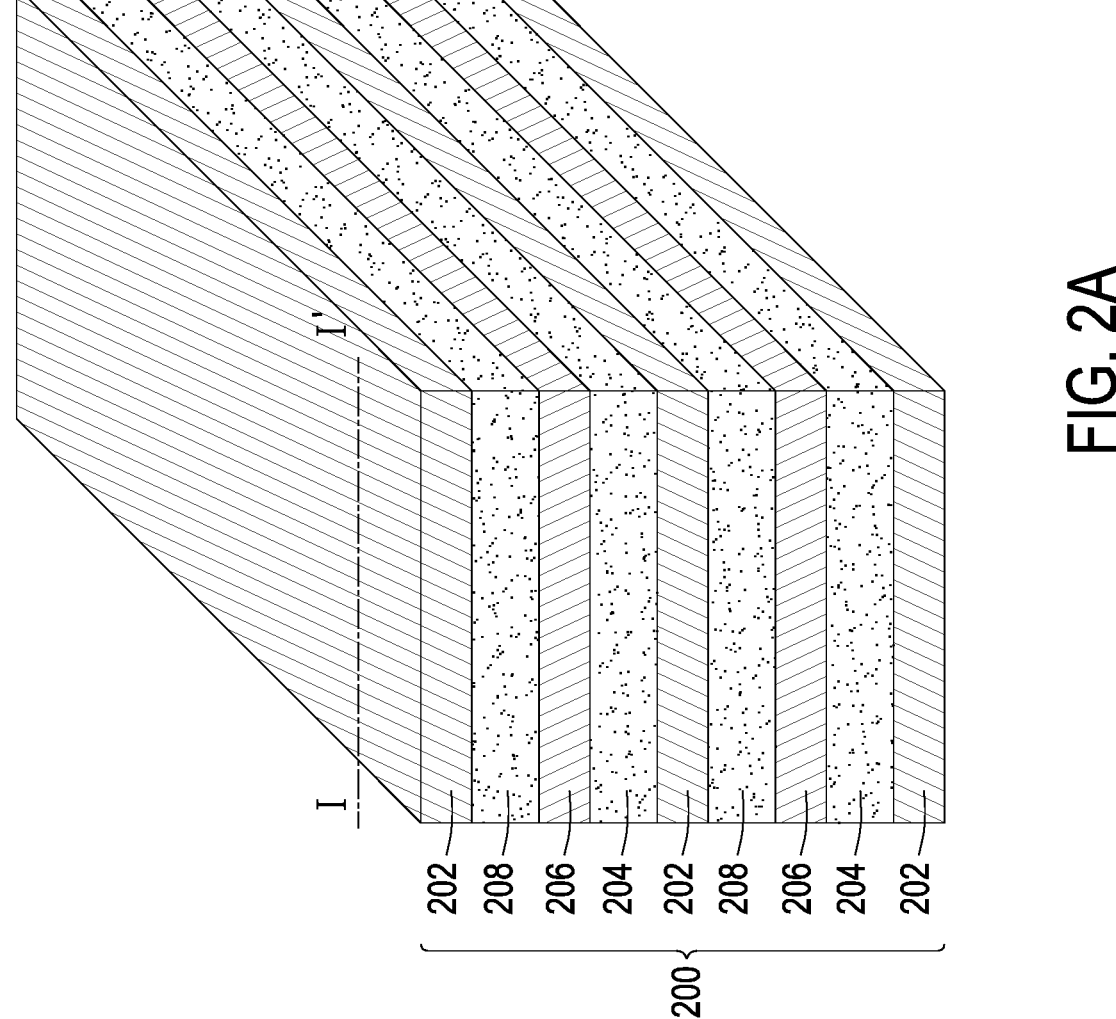
FIG. 2A to FIG. 3H illustrate varying views of a method of forming a memory device in accordance with some embodiments.
Figure 2A:
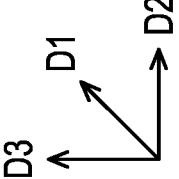
Figure 3A:
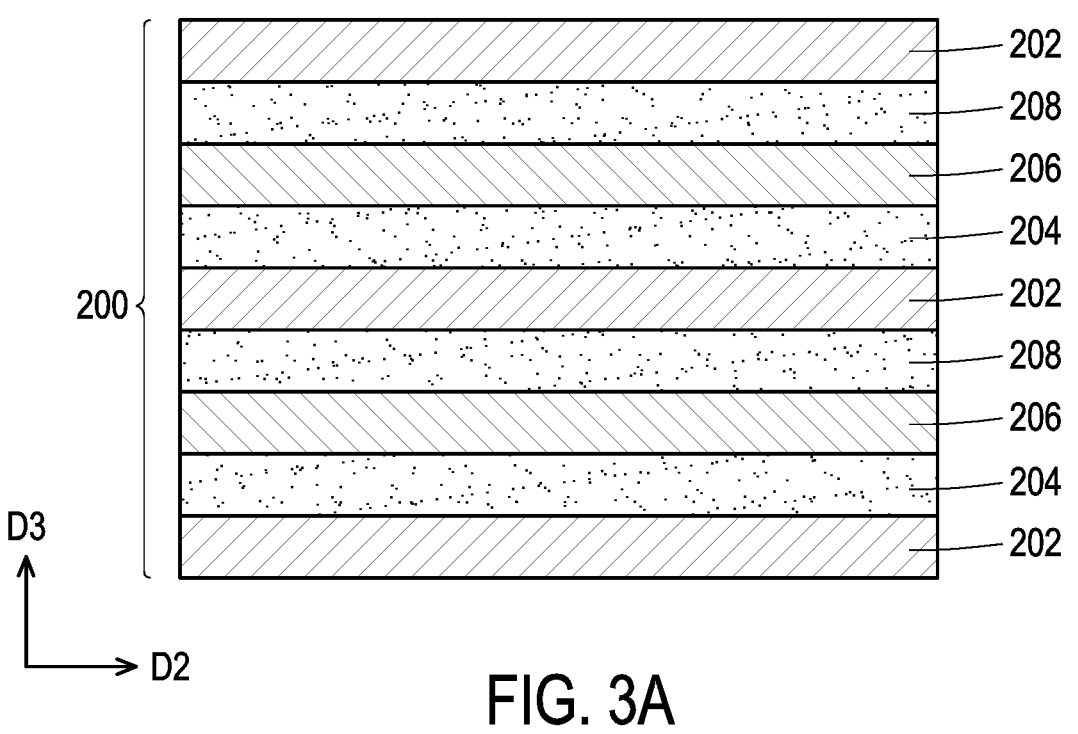
Figure 4:
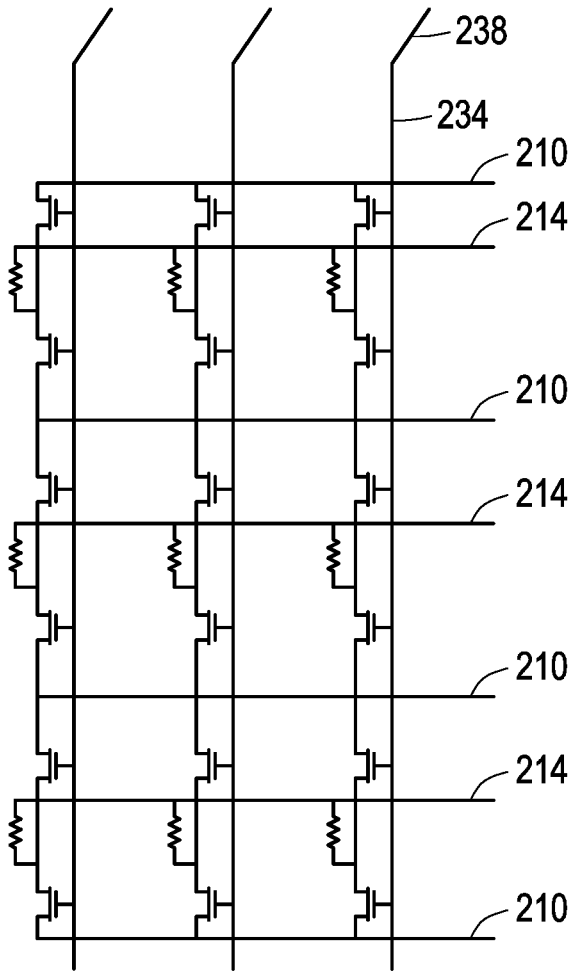
FIG. 4 is a circuit diagram of a memory device of FIG. 2G.

Referring to FIG. 2A and FIG. 3A, a multi-layer stack 200 is formed. In some embodiments, the multi-layer stack 200 includes a plurality of first conductive layers 202, a plurality of first dielectric layers 204, a plurality of second conductive layers 206, and a plurality of second dielectric layers 208. The first conductive layers 202, the first dielectric layers 204, the second conductive layers 206 and the second dielectric layers 208 are alternately stacked on one another. For example, the first conductive layer 202 and the second conductive layer 206 are respectively sandwiched between the first dielectric layer 204 and the second dielectric layer 208. In some embodiments, the first conductive layers 202, the first dielectric layers 204, the second conductive layers 206 and the second dielectric layers 208 are extended along a first direction D1 (e.g., Y direction) and a second direction D2 (e.g., X direction), and are alternately stacked in a third direction D3 (e.g., Z direction). The first direction D1, the second direction D2 and the third direction D3 are substantially perpendicular to one another. The first direction D1 and the second direction D2 are horizontal directions, and third direction D3 is a vertical direction, for example. In some embodiments, the topmost first dielectric layer 204 is also the topmost layer of the multi-layer stack 200.

The first conductive layer 202 and the second conductive layer 206 have the same or different materials. In some embodiments, the first conductive layer 202 and the second conductive layer 206 include copper, titanium, titanium nitride, tantalum, tantalum nitride, tungsten, ruthenium, aluminum, combinations thereof, or the like. In some embodiments, the first conductive layer 202 and the second conductive layer 206 are made by a single material such as TiN. In some embodiments, the first conductive layer 202 and the second conductive layer 206 are respectively a multi-layer structure. For example (not shown), the first conductive layer 202 and the second conductive layer 206 respectively include two barrier layers and a metal layer between the barrier layers. Specifically, a barrier layer is disposed between the metal layer and the adjacent first dielectric layer 204 and second dielectric layer 208. The barrier layers may prevent the metal layer from diffusion to the adjacent first dielectric layer 204 and second dielectric layer 208. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers are formed of a first conductive material, such as a metal nitride, such as titanium nitride, tantalum nitride, molybdenum nitride, zirconium nitride, hafnium nitride, or the like. The metal layer may be formed of a second conductive material, such as a metal, such as tungsten, ruthenium, molybdenum, cobalt, aluminum, nickel, copper, silver, gold, alloys thereof, or the like. The barrier layers and metal layer may each be formed by an acceptable deposition process such as CVD, PVD, ALD, PECVD, or the like.

The first dielectric layer 204 and the second dielectric layer 208 have the same or different materials. In some embodiments, materials of the first dielectric layer 204 and the second dielectric layer 208 are not particularly limited, as long as said materials render good etching selectivity with respect to the first and second conductive layers 202 and 206. For example, the etching selectivity between the first and second dielectric layers 204 and 208 and the first and second conductive layers 202 and 206 ranges between 1:10 and 1:10000. Herein, the etching selectivity is denoted by a ratio between an etch rate of the first and second dielectric layers 204 and 208 and the first and second conductive layers 202 and 206.

In some embodiments, the first dielectric layer 204 and the second dielectric layer 208 are formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In some embodiments, the first dielectric layer 204 and the second dielectric layer 208 are respectively made of a single layer having one of the foregoing materials. However, the disclosure is not limited thereto. In alternative embodiments, the first dielectric layer 204 and the second dielectric layer 208 are respectively made of a laminate structure of at least two of the foregoing materials.

Figure 3B:
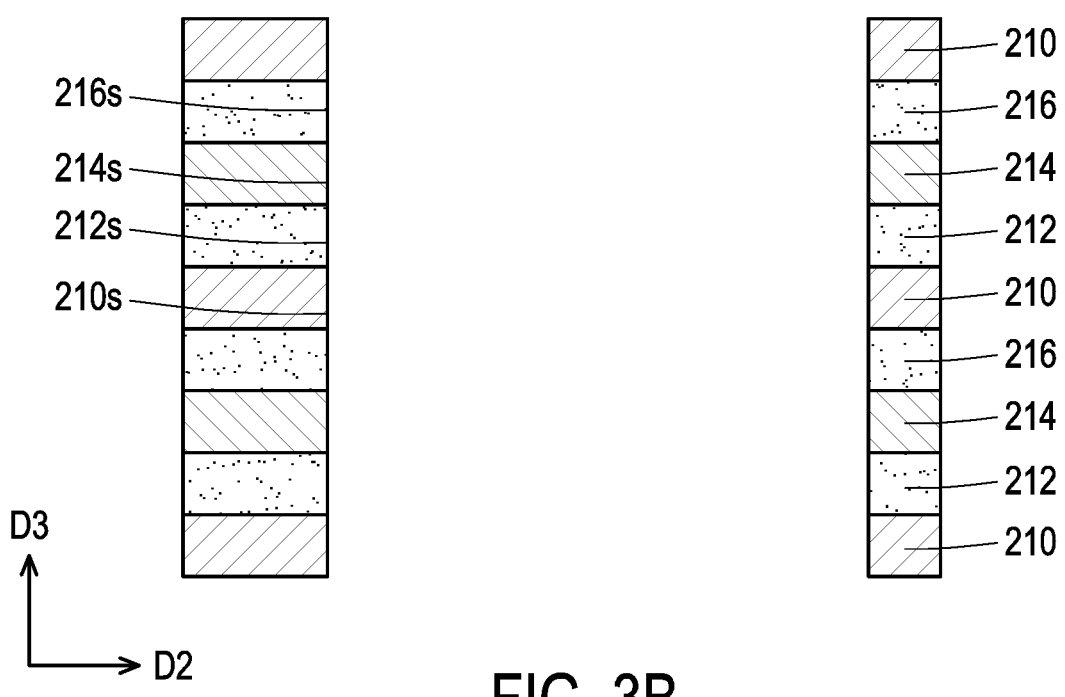

Referring to FIG. 2B and FIG. 3B, the multi-layer stack 200 is patterned, to form a plurality of first conductive lines 210, a plurality of second conductive lines 214 and a plurality of patterned dielectric layers 212, 216. As shown in FIG. 2B, the first conductive lines 210 are respectively extended along the first direction D1, and the first conductive lines 210 are arranged along the second direction D2. Similarly, the second conductive lines 214 are respectively extended along the first direction D1, and the second conductive lines 214 are arranged along the second direction D2. As shown in FIG. 3B, the first conductive lines 210 and the second conductive lines 214 may be stacked alternately along the third direction D3 with the dielectric layer 212, 216 therebetween. In some embodiments, sidewalls 210s of the first conductive lines 210, sidewalls 212s of the first dielectric layers 212, sidewalls 214s of the second conductive lines 214, and sidewalls 216s of the second dielectric layers 216 are substantially aligned with one another.

Figure 2C:
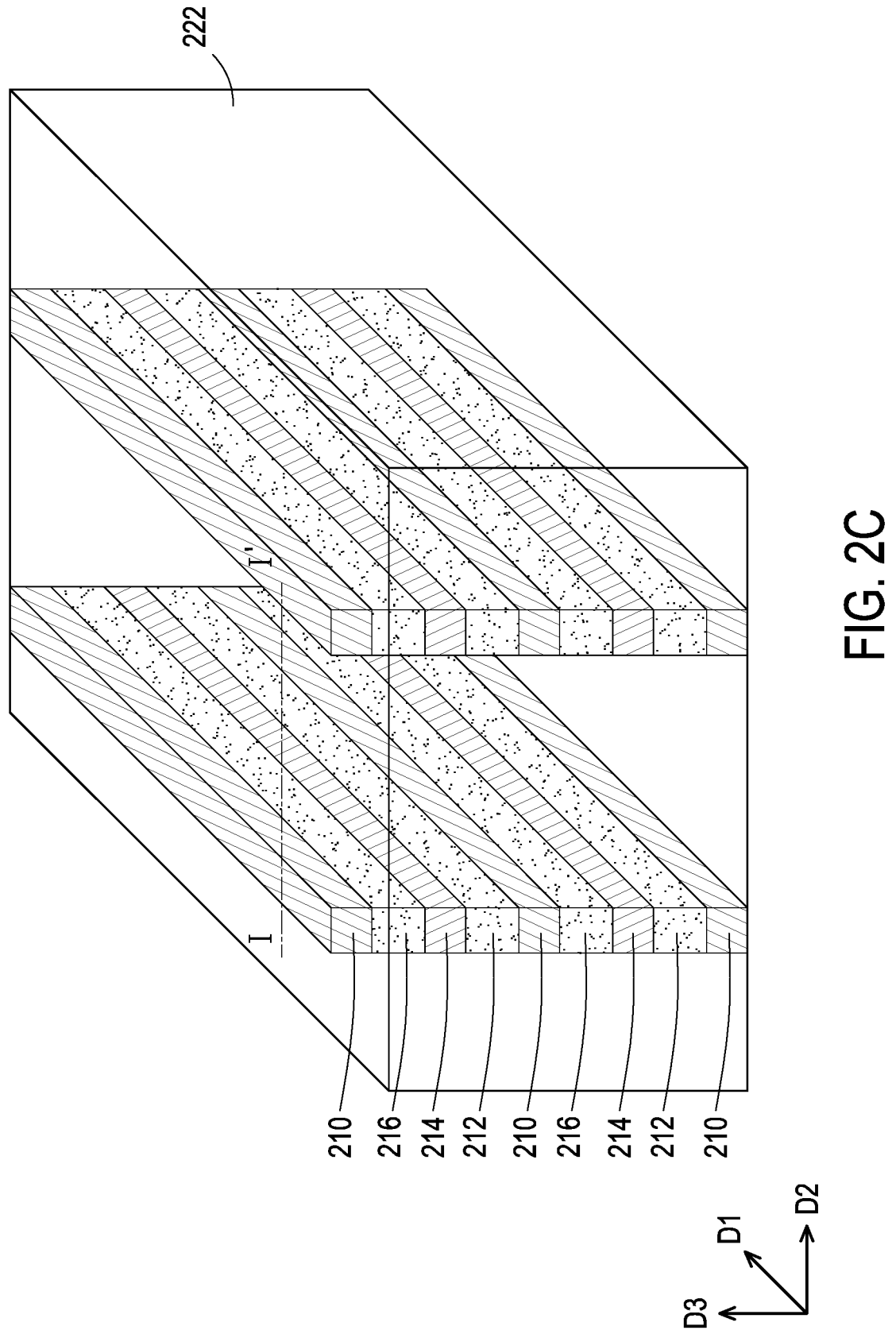
Figure 3C:
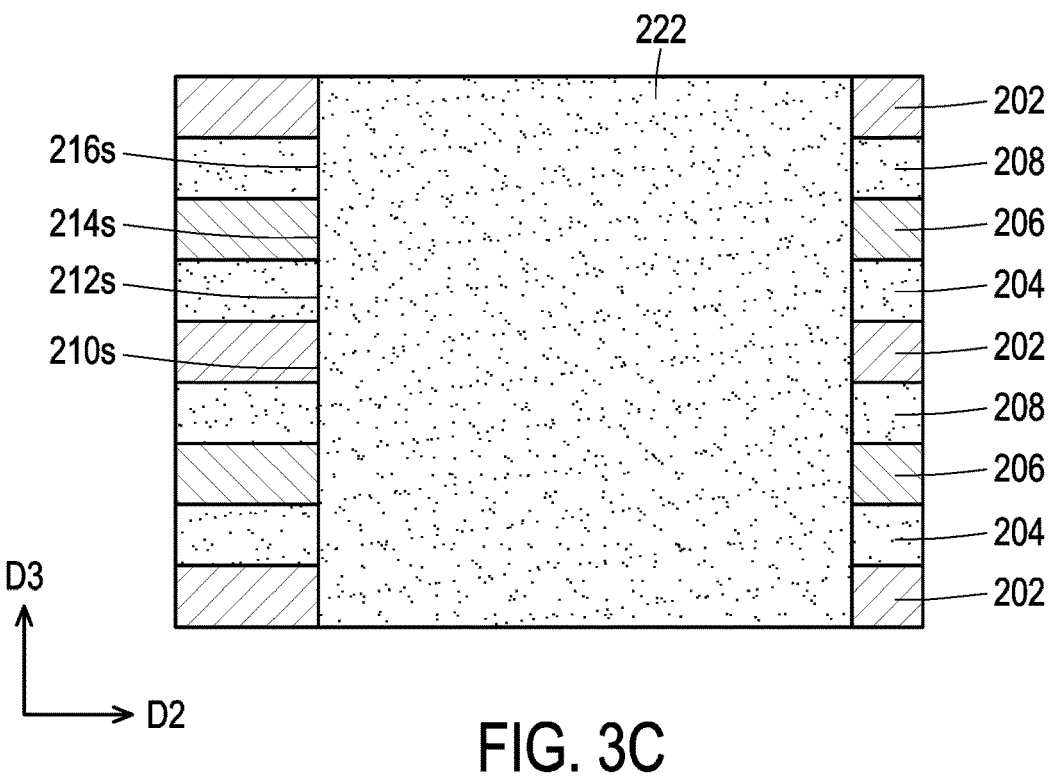

Referring to FIG. 2C and FIG. 3C, a dielectric layer 222 is formed to surround the first and second conductive lines 210 and 214 and the dielectric layers 212 and 216. This step may be also referred to as a refill step. The dielectric layer 222 has a material the same as or different from the first and second dielectric layers 212 and 216, as long as said material renders good etching selectivity with respect to the first and second conductive lines 210 and 214. In some embodiments, the dielectric layer 222 may include silicon oxide, silicon nitride, silicon oxynitride, phosphosilicate glass (PSG), borosilicate glass (BSG), boron-doped phosphosilicate glass (BPSG), or low-k materials. The dielectric layer 222 may be formed by depositing a dielectric material and performing a planarization (e.g., a CMP, etch back, or the like) to remove excess portions of the dielectric material higher than the topmost first conductive lines 210. In the resulting structure, top surfaces of the topmost first conductive line 210 and the dielectric layer 222 may be substantially level (e.g., within process variations). In some embodiments, the dielectric layers 212, 216 and 222 are also referred to as ILD layers. In some embodiments in which the materials of the dielectric layers 212, 216 and 222 are the same, the interface does not exist between the dielectric layers 212, 216 and 222.

Figure 2D:
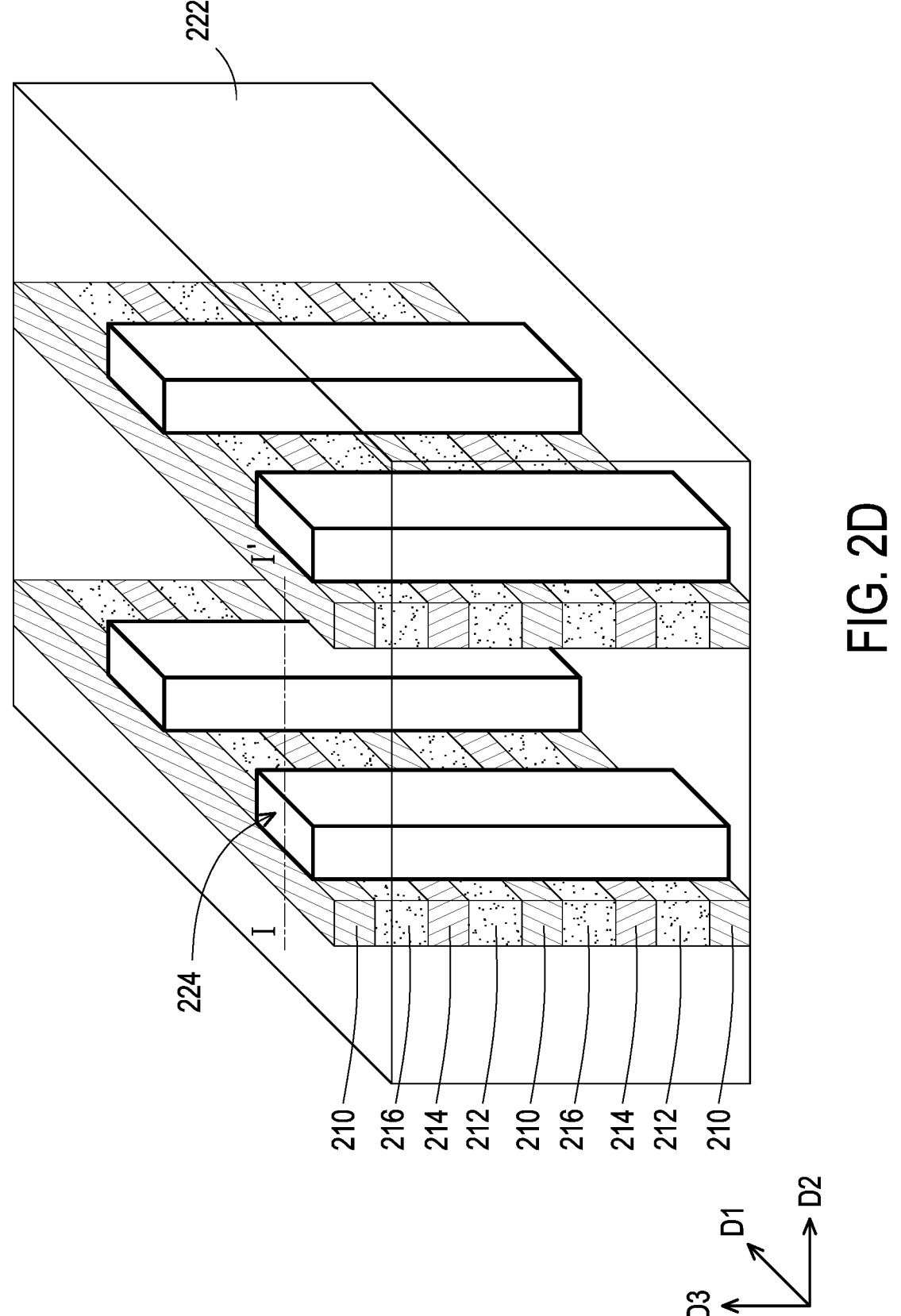
Figure 3D:
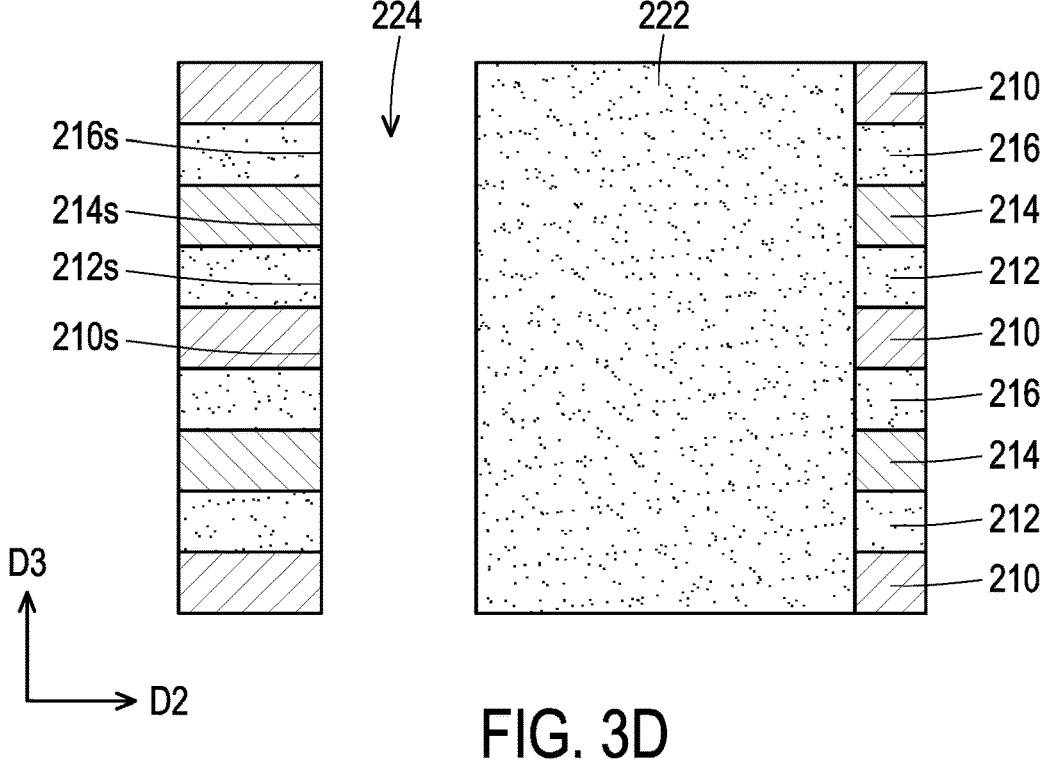

Referring to FIG. 2D and FIG. 3D, a plurality of openings 224 are formed in the dielectric layer 222, to expose portions of the first conductive lines 210 and the second conductive lines 214. In some embodiments, the opening 224 penetrates through the dielectric layer 222, and exposes the sidewalls 210s of the first conductive lines 210, the sidewalls 212s of the first dielectric layers 212, the sidewalls 214s of the second conductive lines 214, and the sidewalls 216s of the second dielectric layers 216. In some embodiments, as shown in FIG. 2D, the openings 224 are arranged in an array along the first direction D1 and the second direction D2, and each opening 224 is disposed at the same side of the stacked first and second conductive lines 210, 214. In some embodiments, the openings 224 are all formed at the same side of the different stacks of the first and second conductive lines 210, 214. However, the disclosure is not limited thereto. In alternative embodiments, the openings 224 are formed at different sides of the different stacks of the first and second conductive lines 210, 214. In alternative embodiments, the openings 224 are formed at different sides of one stack of the first and second conductive lines 210, 214. For example, the openings 224 are disposed at opposite sides of one stack of the first and second conductive lines 210, 214.

Figure 3E:
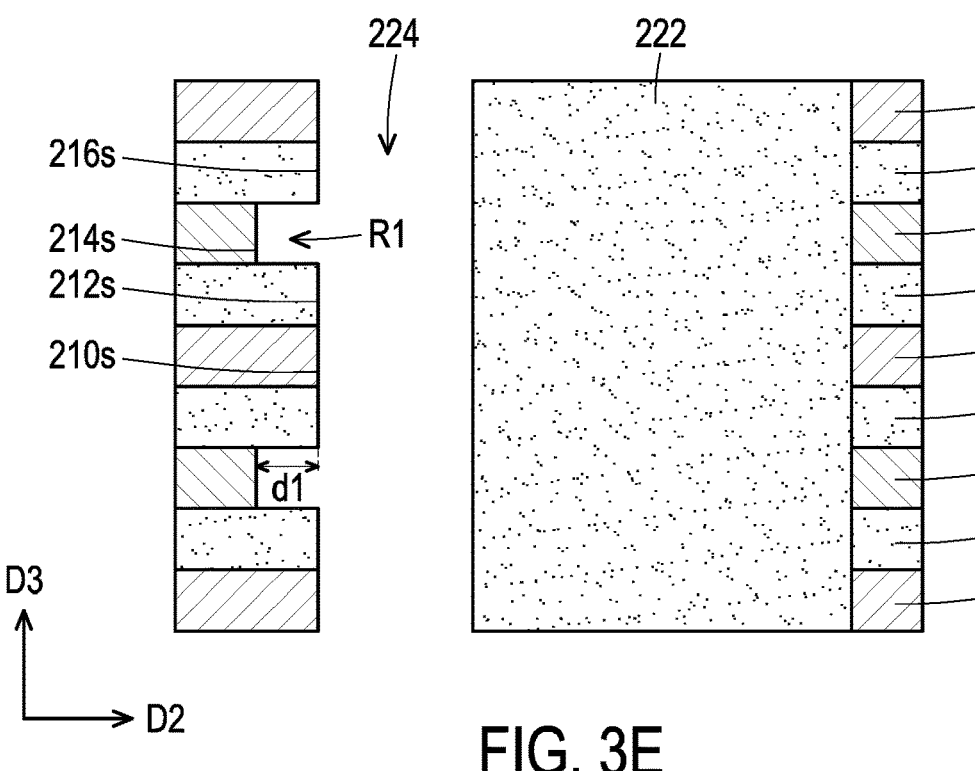

Referring to FIG. 3E, the second conductive lines 214 are laterally recessed through the openings 224 by using an etching process. In some embodiments, portions of the second conductive lines 214 exposed by the openings 224 are removed, and thus as shown in FIG. 3E, a plurality of recesses R1 are respectively formed between adjacent two of the first dielectric layers 212 and the second dielectric layers 216. The recess R1 exposes the underlying layer such as the first dielectric layer 212. In some embodiments, the recess R1 has a dimension d1 along the second direction D2. In some embodiments, the etching process includes a wet etching process by using a suitable etchant.

Figure 2E:
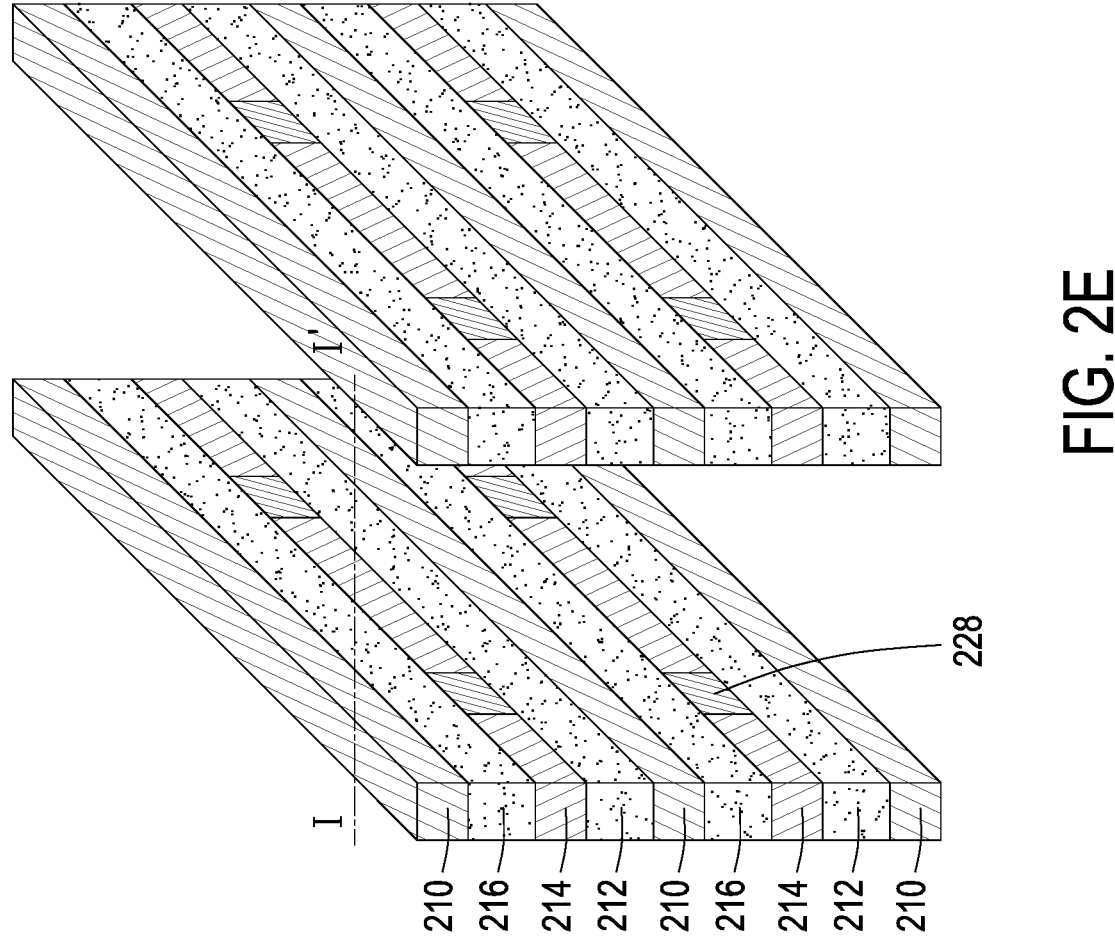
Figure 2E:
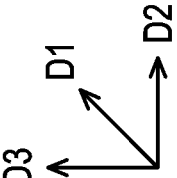
Figure 3F:
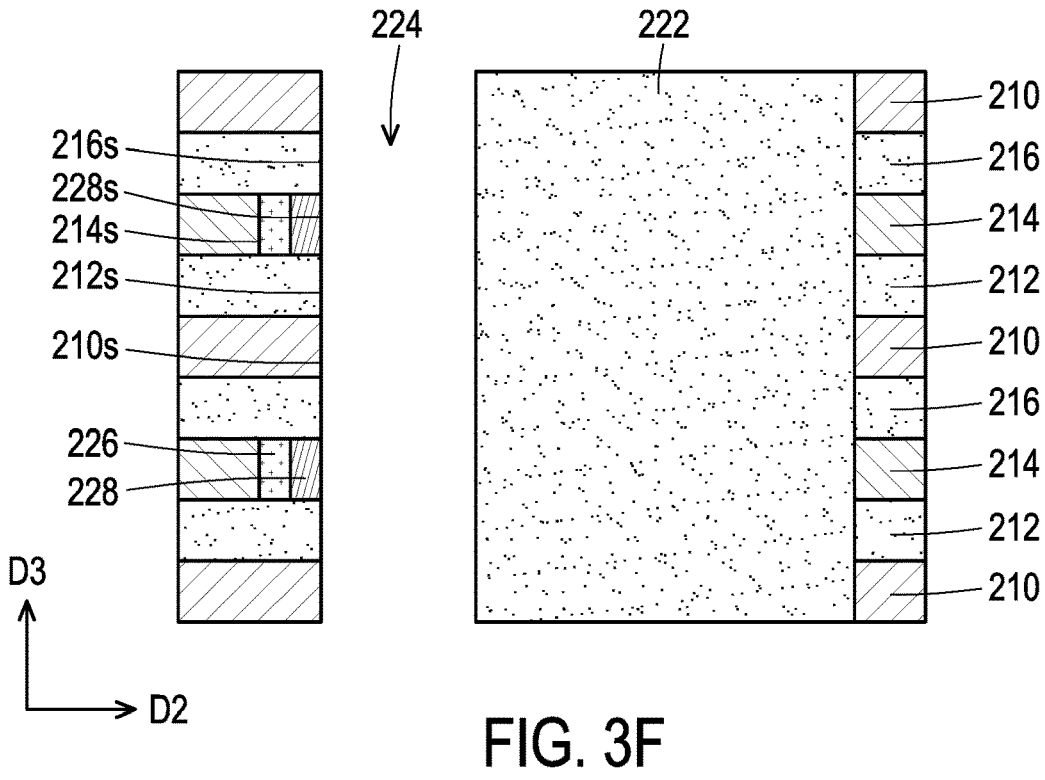

Referring to FIG. 2E and FIG. 3F, memory layers 226 and conductive layers 228 are formed to fill up the recesses R1. For clarity, the dielectric layer 222 is omitted in FIG. 2E. In some embodiments, the memory layers 226 are respectively formed in the recesses R1, to partially fill the recesses R1, and then the conductive layers 228 are respectively formed in the recesses R1 to fill up the recesses R1. In some embodiments, the memory layer 226 includes a material for RRAM, PCM, FeRAM, MRAM, or the like. For example, the memory layer 226 includes a resistive material and configured to store data by a resistance of the memory layer 226. In such embodiments, the memory layer 226 having a variable resistance is configured to store data states by undergoing reversible changes between a high resistance state associated with a first data state (e.g., a '0') and a low resistance state associated with a second data state (e.g., a '1'). The resistive material may include one or more oxide of W, Ta, Ti, Ni, Co, Hf, Ru, Zr, Zn, Fe, Sn, Al, Cu, Ag, Mo and Cr. In some embodiments, the resistive material further includes silicon to form a composite material. In some embodiments, the memory layer 226 includes hafnium oxide and/or zirconium oxide. The conductive layer 228 may have a material the same as or different from the first conductive line 210 and the second conductive line 214. In some embodiments, the conductive layer 228 includes copper, titanium, titanium nitride, tantalum, tantalum nitride, tungsten, ruthenium, aluminum, combinations thereof, or the like.

As shown in FIG. 3F, sidewalls 228s of the conductive layers 228 are substantially aligned with (flush with) the sidewalls 210s of the first conductive lines 210, the sidewalls 212s of the first dielectric layers 212 and the sidewalls 216s of the second dielectric layers 216, for example. A total dimension of the memory layer 226 and the conductive layer 228 along the second direction D2 may correspond to the dimension d1 of the recess R1. In some embodiments, the memory layer 226 is disposed between and in direct contact with the second conductive line 214 and the conductive layer 228. The top surfaces of the memory layer 226 and the conductive layer 228 are substantially coplanar, and the bottom surfaces of the memory layer 226 and the conductive layer 228 are substantially coplanar, for example. In some embodiments, the conductive layers 228 are also referred to as inter-metals, conductive pattens or conductive lines.

Figure 2F:
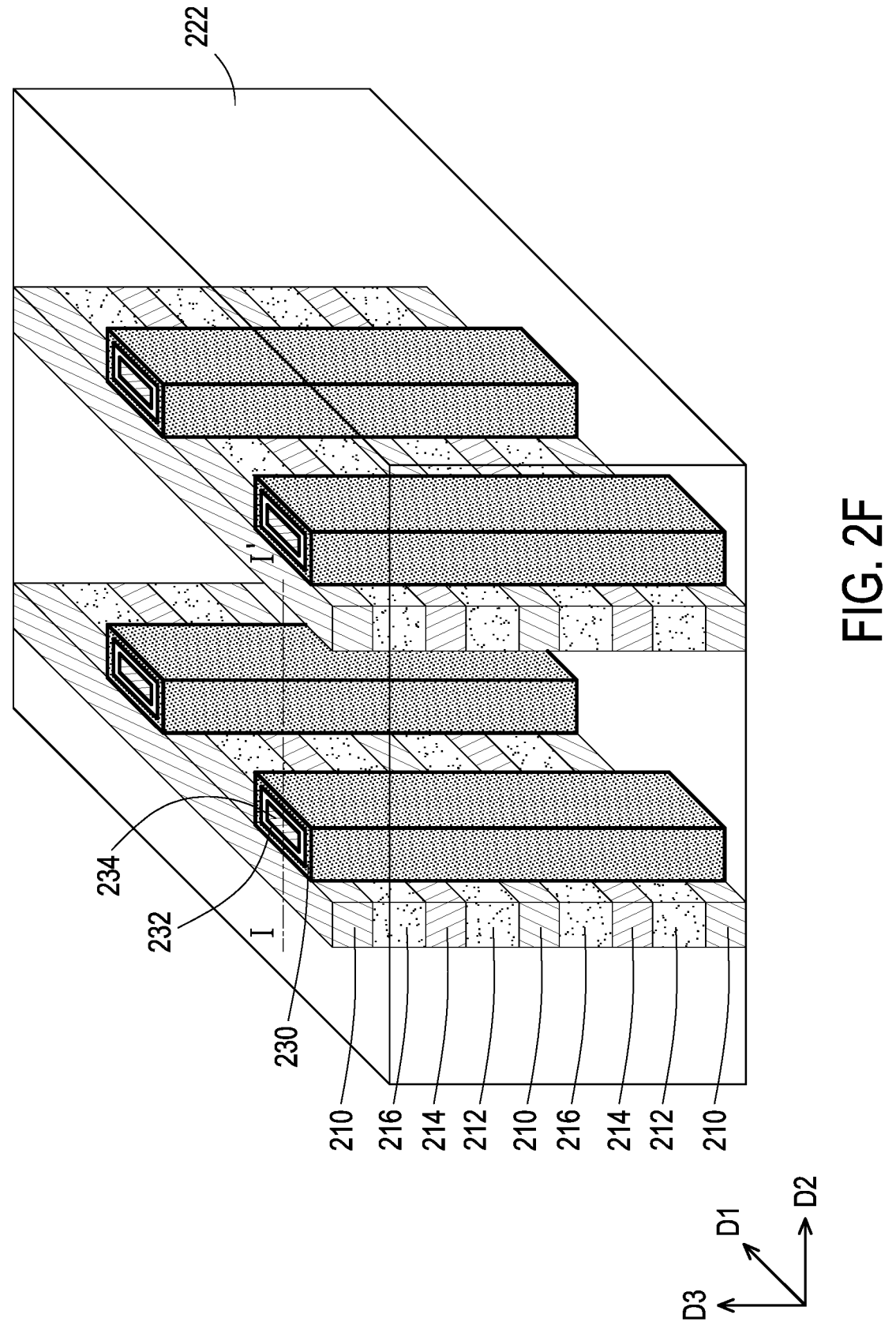
Figure 3G:
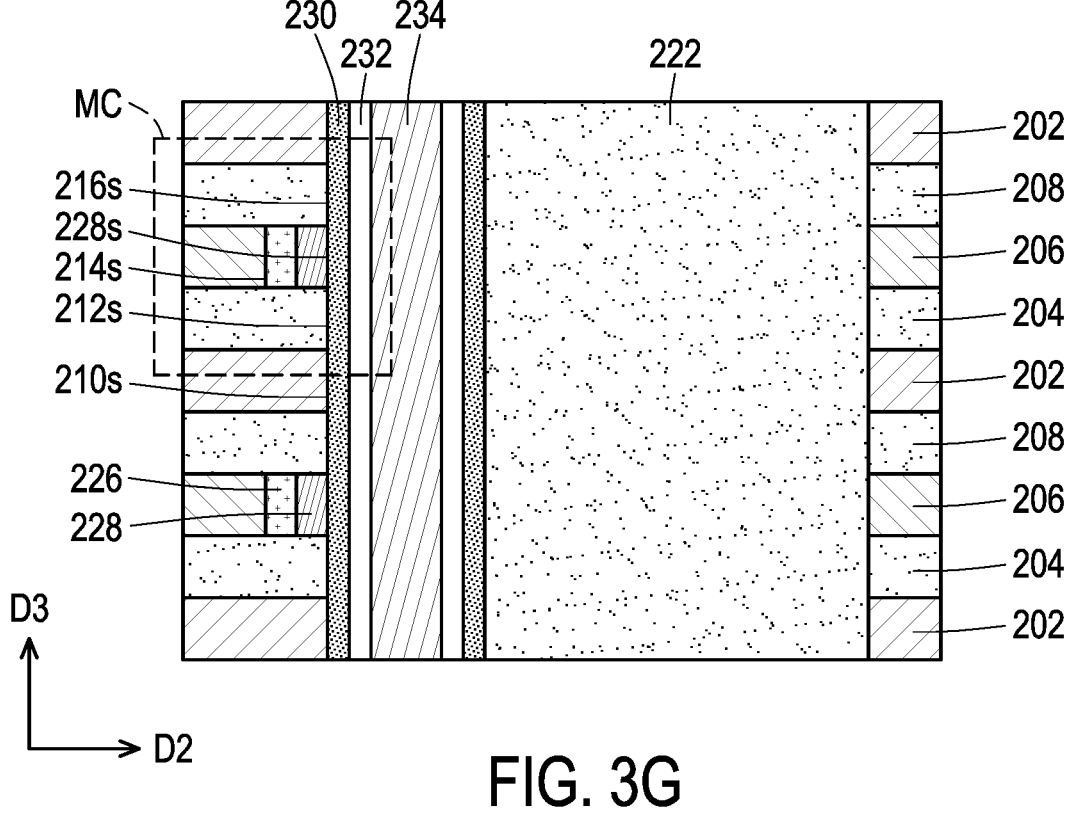

Referring to FIG. 2F and FIG. 3G, a plurality of semiconductor layers 230 are respectively formed along sidewalls of the openings 224. In some embodiments, the semiconductor layers 230 are respectively formed along the sidewalls 210s of the first conductive lines 210, the sidewalls 212s of the first dielectric layers 212, the sidewalls 228s of the conductive layers 228 and the sidewalls 216s of the second dielectric layers 216. In some embodiments, the semiconductor layer 230 includes silicon, germanium, III-V semiconductor, IGZO, IZO, AZO, the like or a combination thereof. The semiconductor layer 230 may be formed by a deposition process such as ALD, CVD, PVD, or the like.

Then, a plurality of dielectric layers 232 and a plurality of conductive lines 234 are sequentially formed to fill the openings 224, for example. In some embodiments, the dielectric layer 232 is formed along sidewalls of the semiconductor layer 230, and the conductive line 234 is formed on the dielectric layer 232 to fill up the opening 224. In some embodiments, the dielectric layer 232 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the conductive line 234 includes copper, titanium, titanium nitride, tantalum, tantalum nitride, tungsten, ruthenium, aluminum, combinations thereof, or the like. The semiconductor layer 230, the dielectric layer 232 and the conductive line 234 may be formed by sequentially depositing a semiconductor material, a dielectric material and a conductive material and performing a planarization (e.g., a CMP, etch back, or the like) to remove excess portions of the semiconductor material, the dielectric material and the conductive material outside the opening 224. In the resulting structure, top surfaces of the topmost first conductive lines 210, the semiconductor layers 230, the dielectric layers 232, the conductive lines 234 and the dielectric layer 222 may be substantially level (e.g., within process variations). In some embodiments, as shown in FIG. 2F, the conductive line 234 is extended along the third direction D3 while the conductive line 210 and the second conductive line 214 are extended along the first direction D1. In some embodiments, the semiconductor layer 230 extends along the third direction D3 to surround the dielectric layer 232 and the conductive line 234, and the dielectric layer 232 extends along the third direction D3 to surround the conductive line 234. In some embodiments, the semiconductor layer 230 is in direct contact with the conductive layer 228 and the dielectric layer 232.

In some embodiments, the conductive lines 234 are arranged in an array along the first direction D1 and the second direction D2. For example, each conductive line 234 is disposed at the same side of the stacked first and second conductive lines 210, 214. In some embodiments, the conductive lines 234 are all formed at the same side of the different stacks of the first and second conductive lines 210, 214. However, the disclosure is not limited thereto. In alternative embodiments, the conductive lines 234 are formed at different sides of the different stacks of the first and second conductive lines 210, 214. In addition, the conductive lines 234 may be formed at different sides of one stack of the first and second conductive lines 210, 214. For example, the conductive lines 234 are disposed at opposite sides of one stack of the first and second conductive lines 210, 214.

Figure 2G:
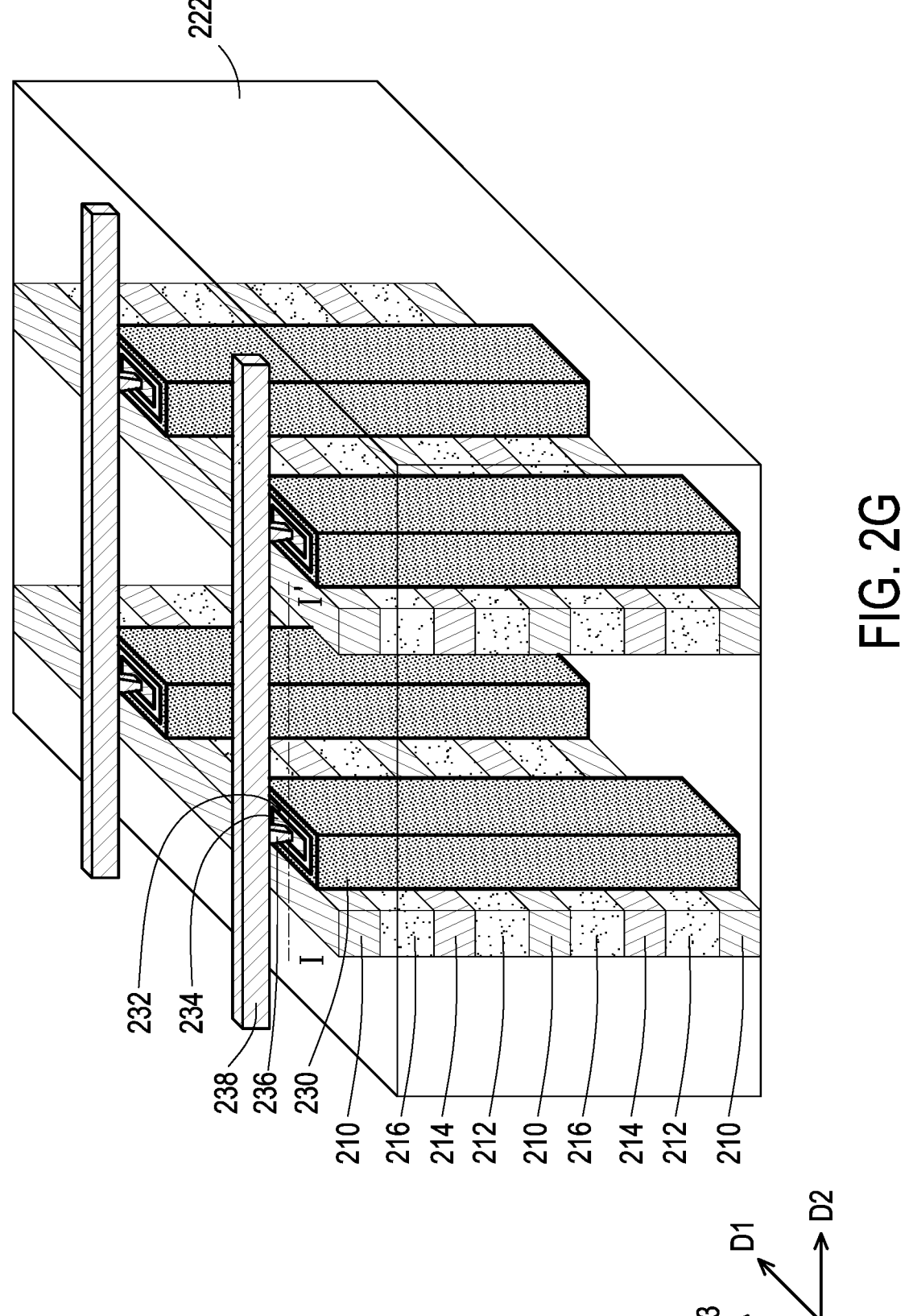
Figure 3H:
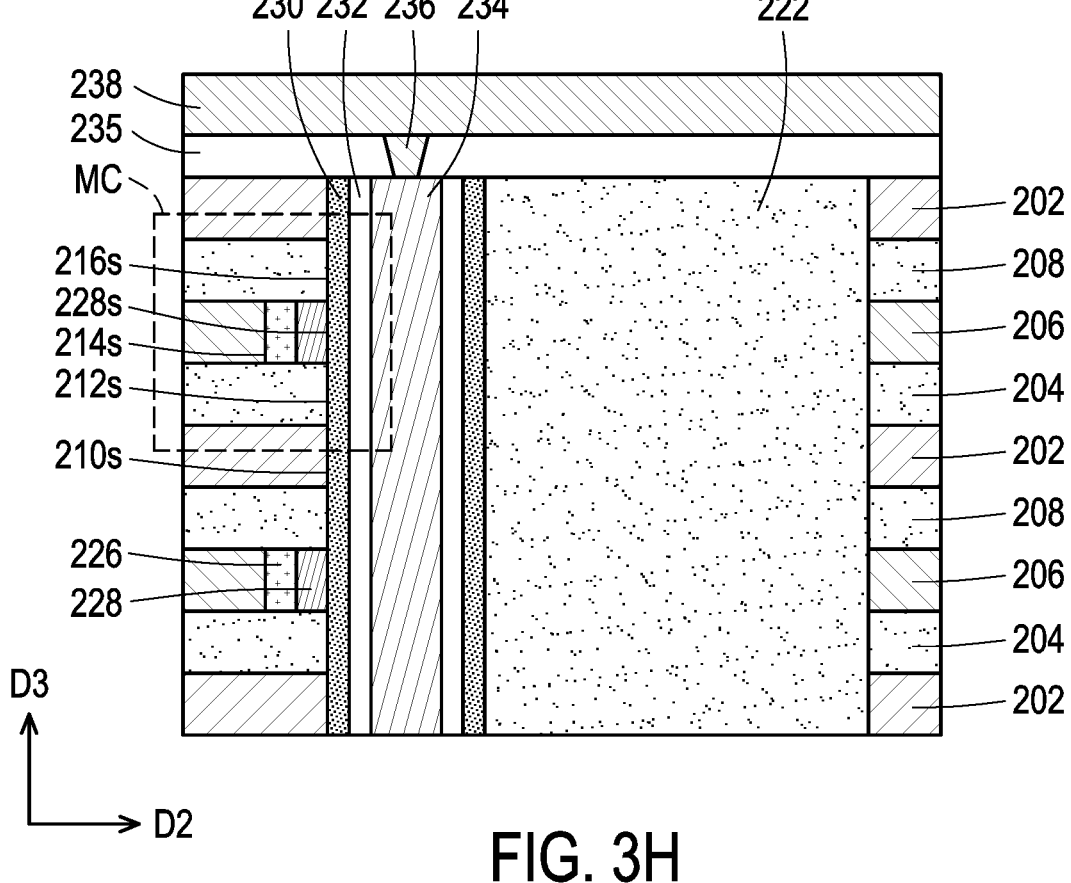

Referring to FIG. 2G and FIG. 3H, a plurality of conductive lines 238 are formed to electrically connect to the conductive lines 234. In some embodiments, the conductive lines 238 extend along the second direction D2, and the conductive lines 238 cross over the conductive lines 210, 214 therebelow. For example, the conductive lines 238 are formed over the conductive lines 234, and the conductive lines 238 are electrically connected to the conductive lines 234 through contacts 236 therebetween. In some embodiments, the contact 236 is formed in a dielectric layer 235 over the topmost first conductive line 210, the semiconductor layer 230, the dielectric layer 232, the conductive line 234 and the dielectric layer 222. The contact 236 is integrally formed with the conductive line 238 thereover, for example. However, the disclosure is not limited thereto. The contact 236 may be formed separately from the conductive line 238.

In some embodiments, the conductive line 238 corresponds to and is electrically connected to a word line while the conductive line 210 corresponds to and is electrically connected to a source line and the conductive line 214 corresponds to and is electrically connected to a bit line. A plurality of memory cells are formed, and the memory cell is operably coupled to the word line, the source line and the bit line. The memory cell may be RRAM, PCM, FeRAM, MRAM or the like. In some embodiments, as shown in FIGS. 2G, FIG. 3H and FIG. 4, the conductive line 234 serves as a gate and the dielectric layer 232 serves as a gate dielectric layer, and two parallel transistors are formed as switch for one memory cell. In some embodiments, the configuration MC of two transistors-one memory cell may be applied to a three-dimensional (3D) NOR type memory device or the like.

Figure 5:
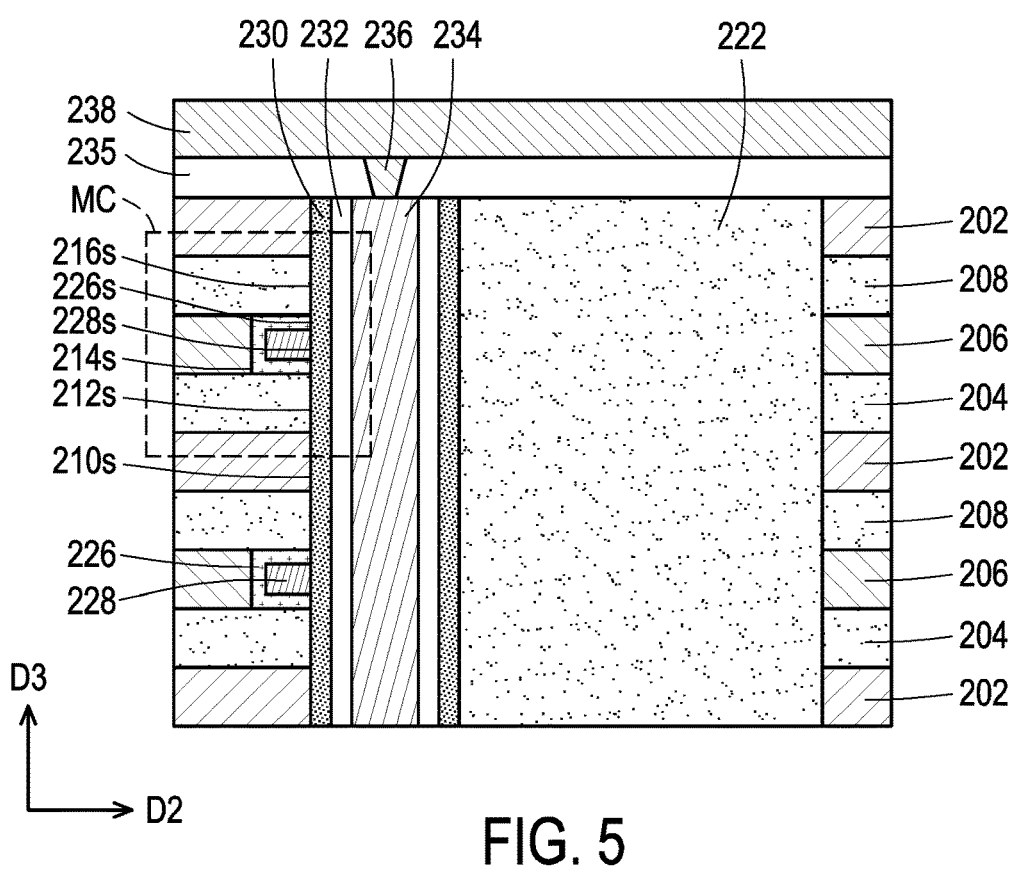
FIG. 5 illustrates a cross-sectional view of a memory device in accordance with some embodiments.
Figure 6:
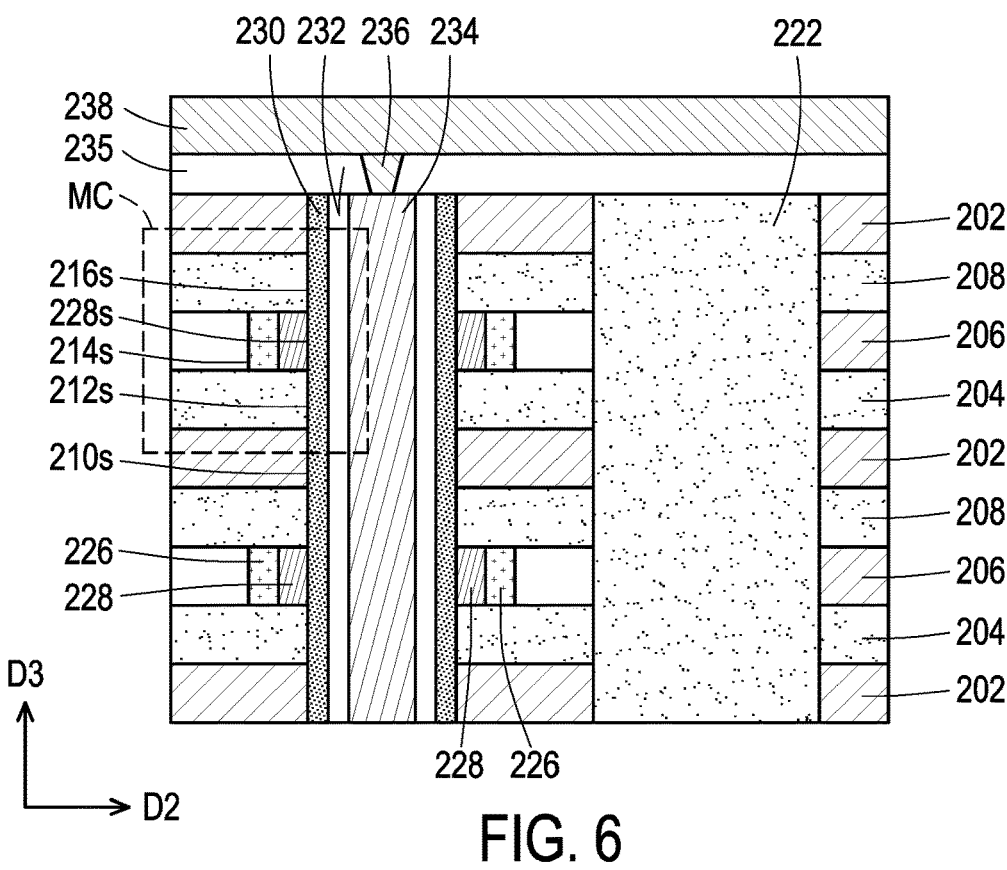
FIG. 6 illustrates a cross-sectional view of memory device in accordance with some embodiments.

In some embodiments, the memory cells are formed at single side of the conductive line 234. However, the disclosure is not limited thereto. In alternative embodiments, as shown in FIG. 5, the memory cells are formed at both sides of the conductive line 234. Furthermore, the memory layer 226 and the conductive layer 228 may have other suitable configurations. For example, as shown in FIG. 6, the memory layer 226 is formed to partially surround the conductive layer 228. In such embodiments, the sidewalls 226s of the memory layers 226 are substantially flush with the sidewalls 228s of the conductive layers 228, the sidewalls 210s of the first conductive lines 210, the sidewalls 212s of the first dielectric layers 212 and the sidewalls 216s of the second dielectric layers 216. The memory layer 226 is in direct contact with the semiconductor layer 230, for example.

Figure 9A:
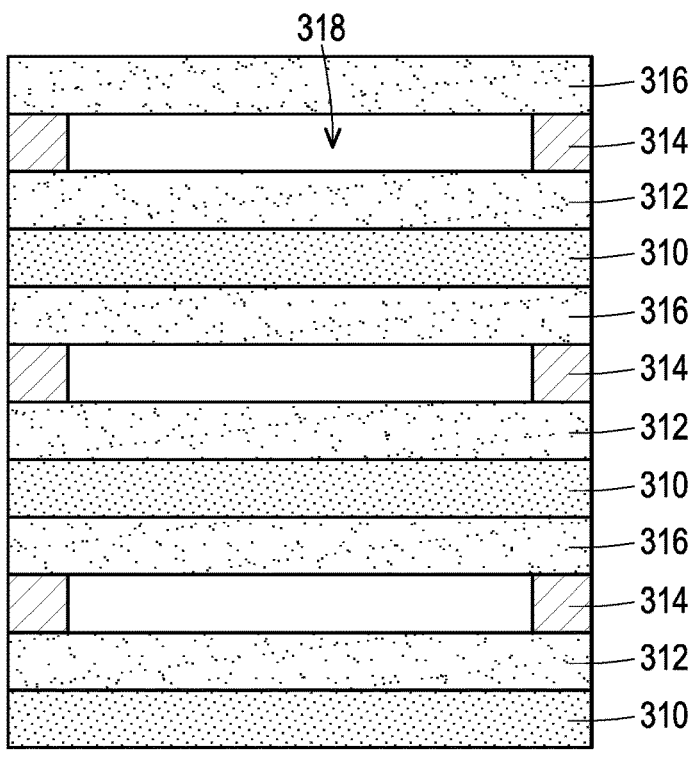
Figure 9B:
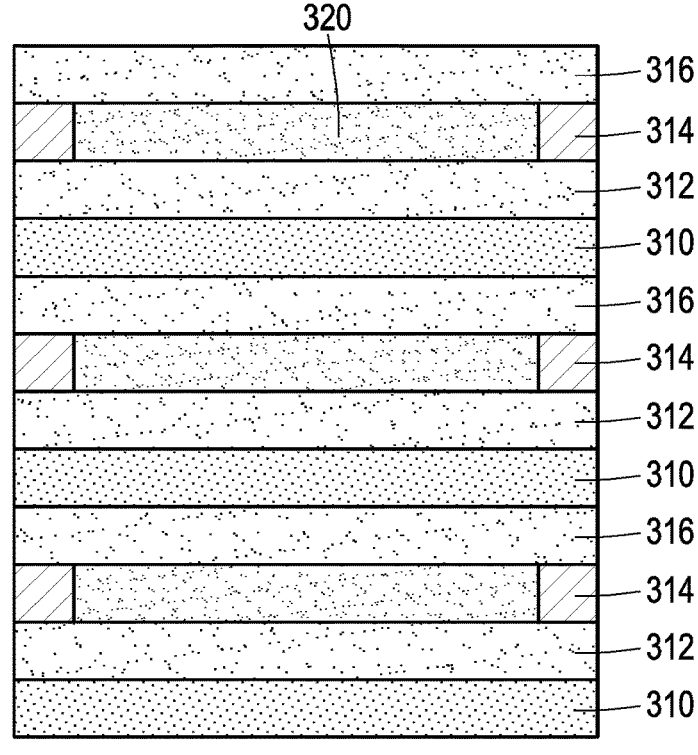
Figure 9B:
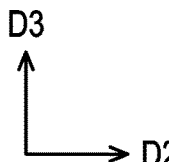
Figures 9C, 9D:
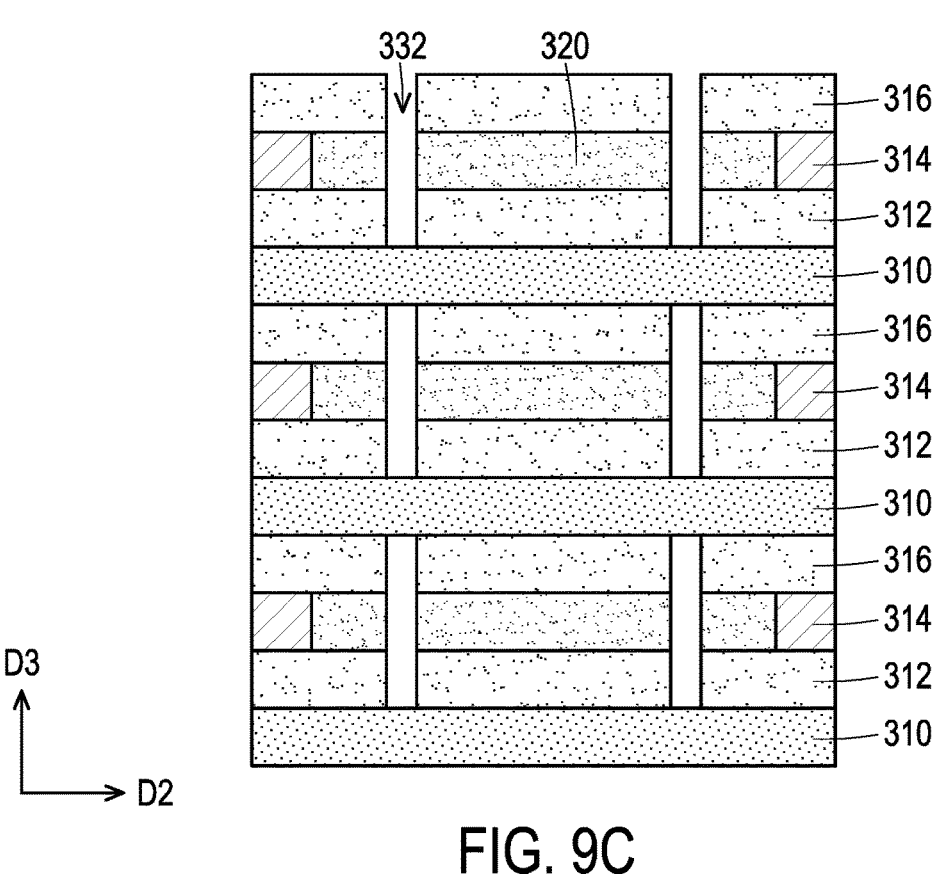
Figure 10A:
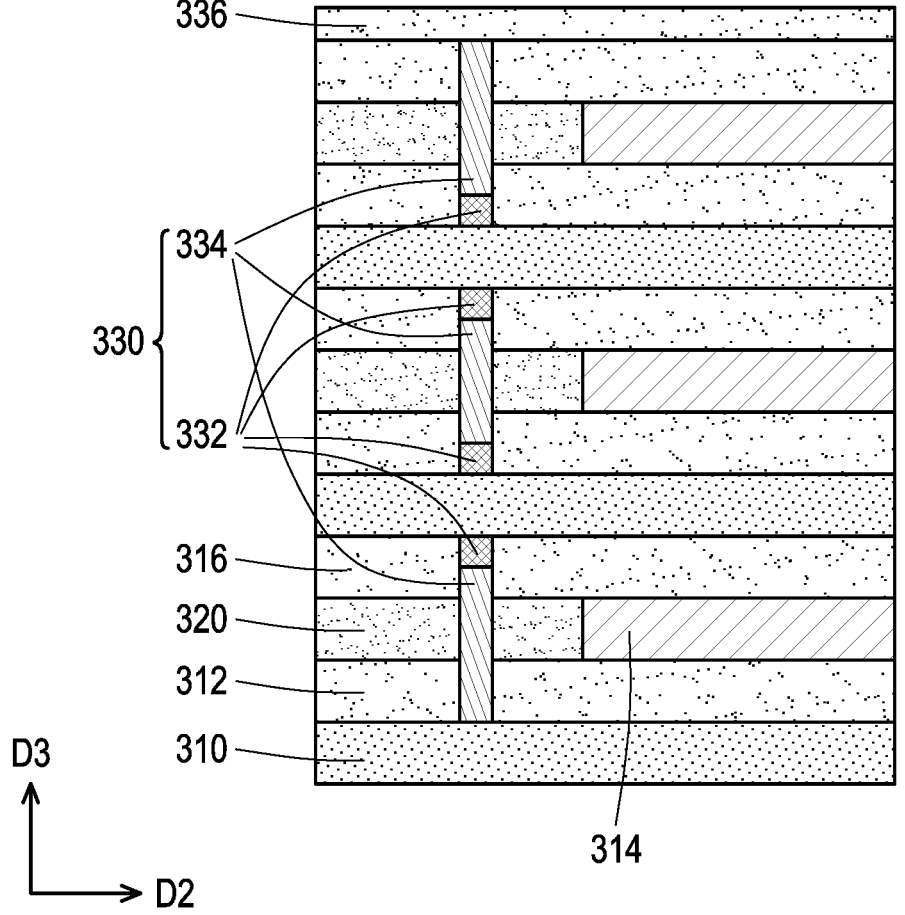
Figure 10B:
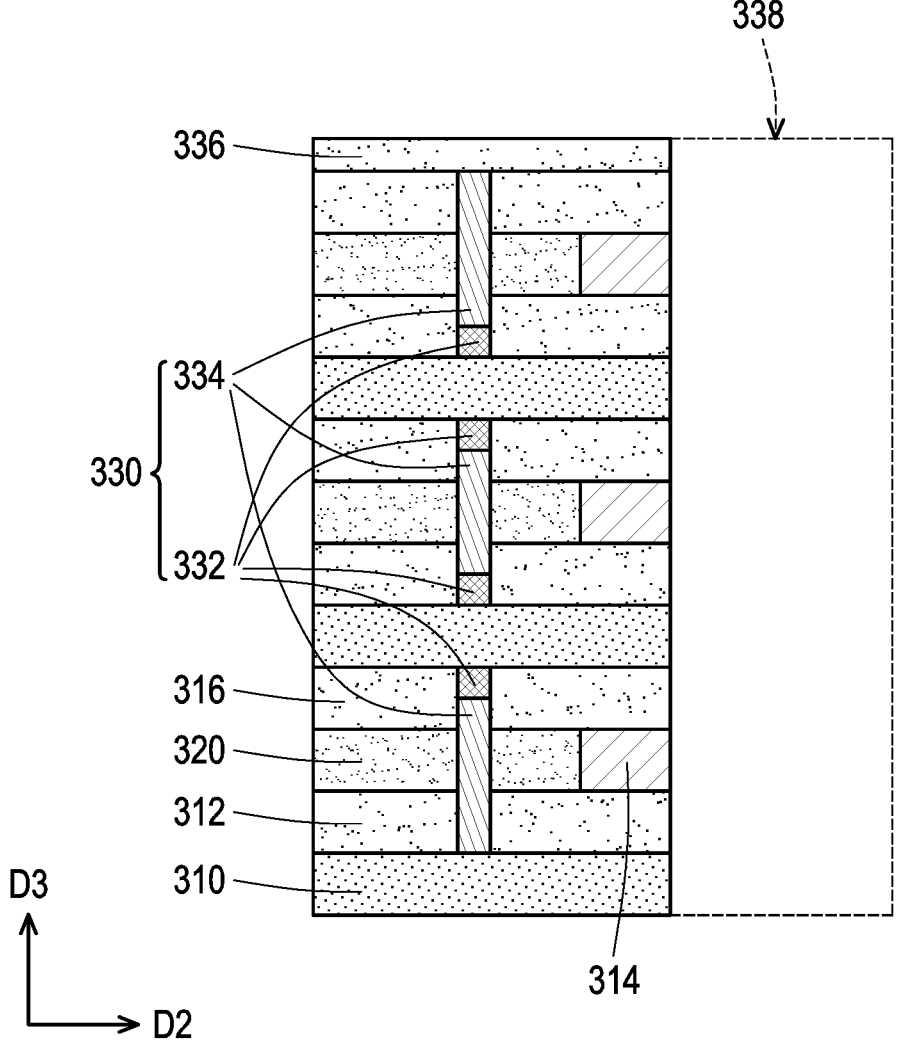
Figure 10C:
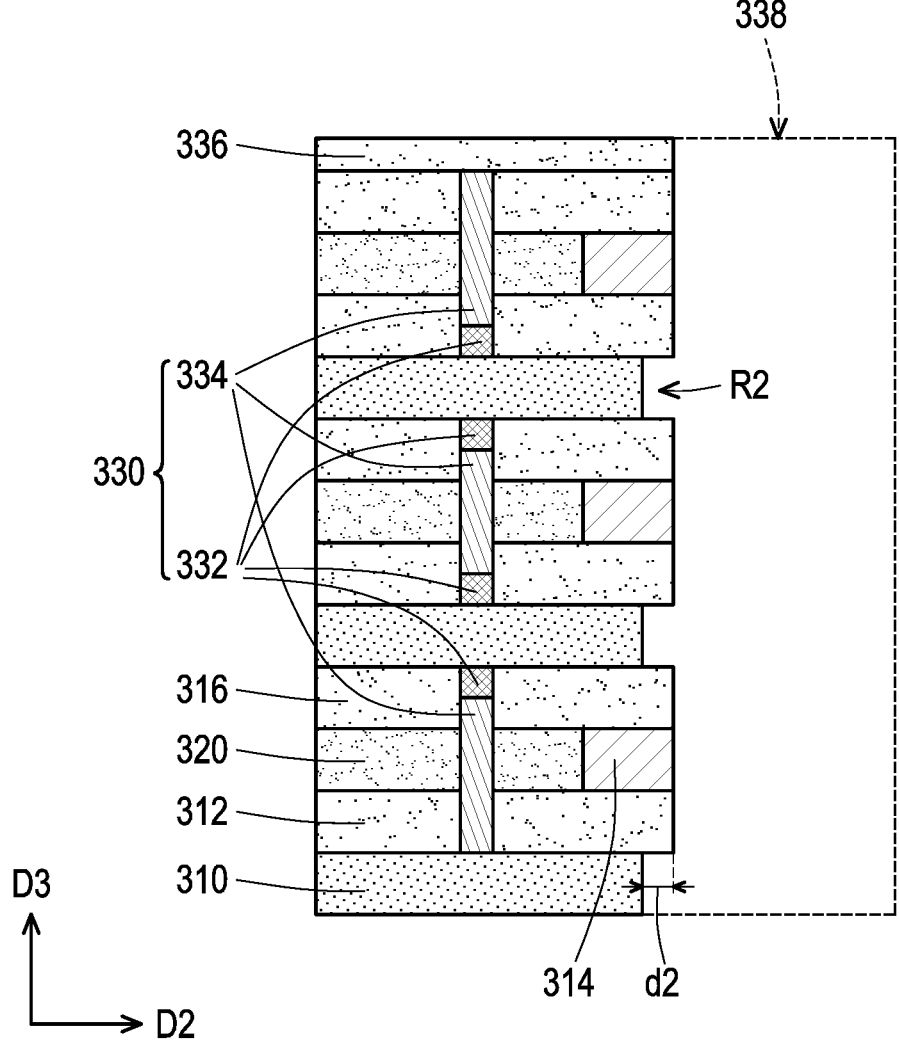
Figure 10D:
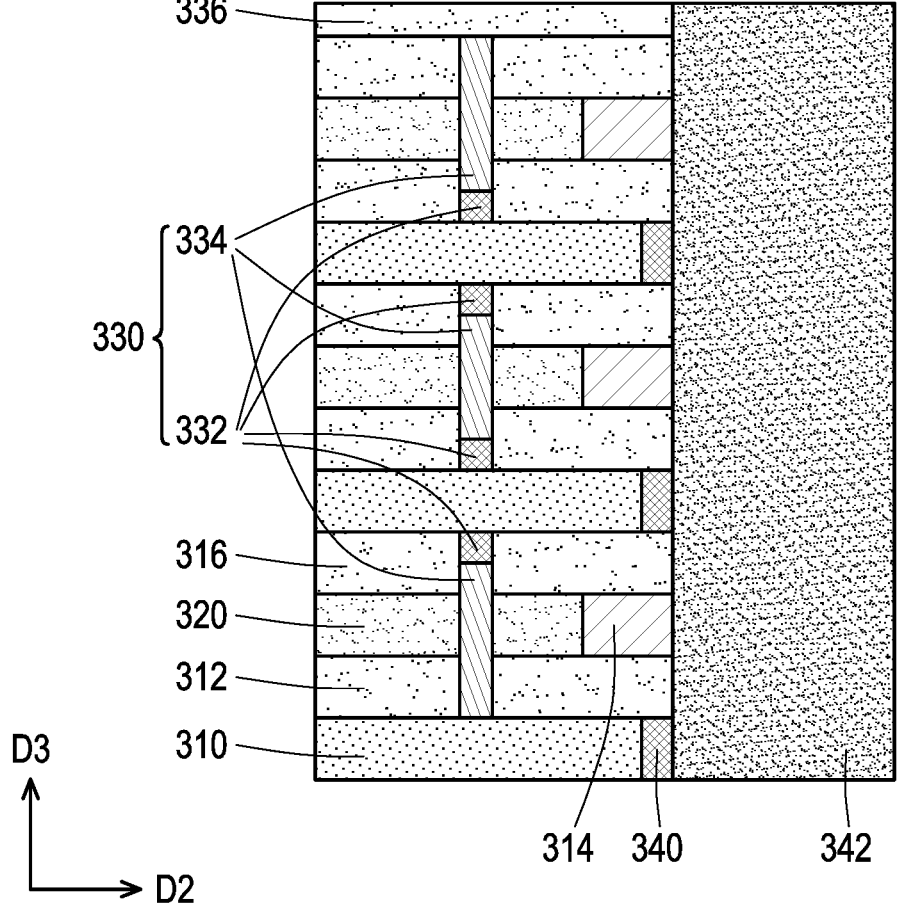
Figure 10E:
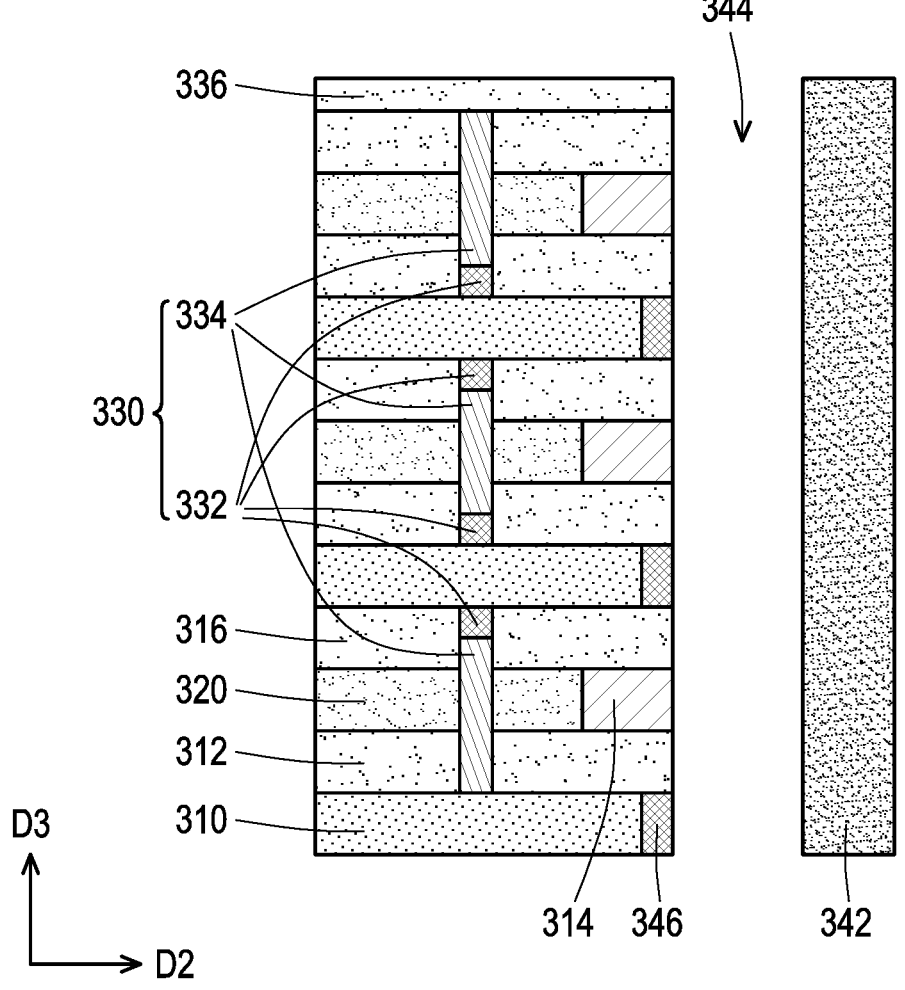
Figure 10F:
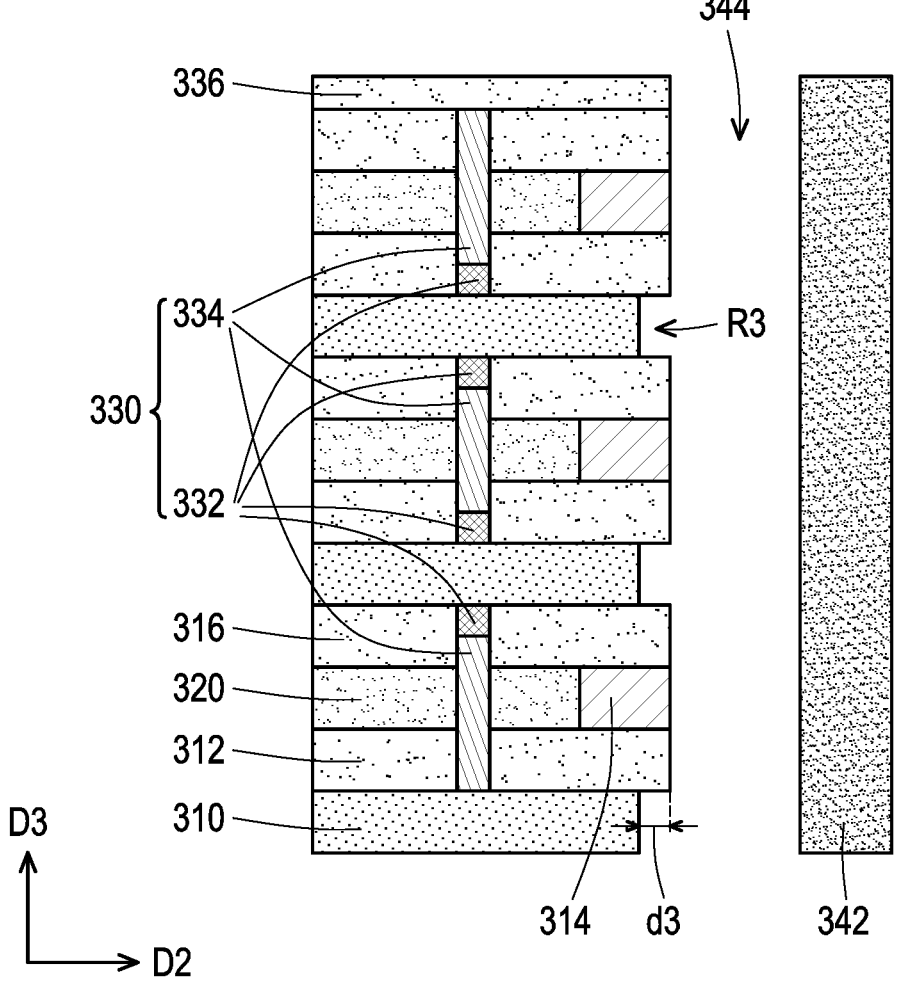
Figure 10G:
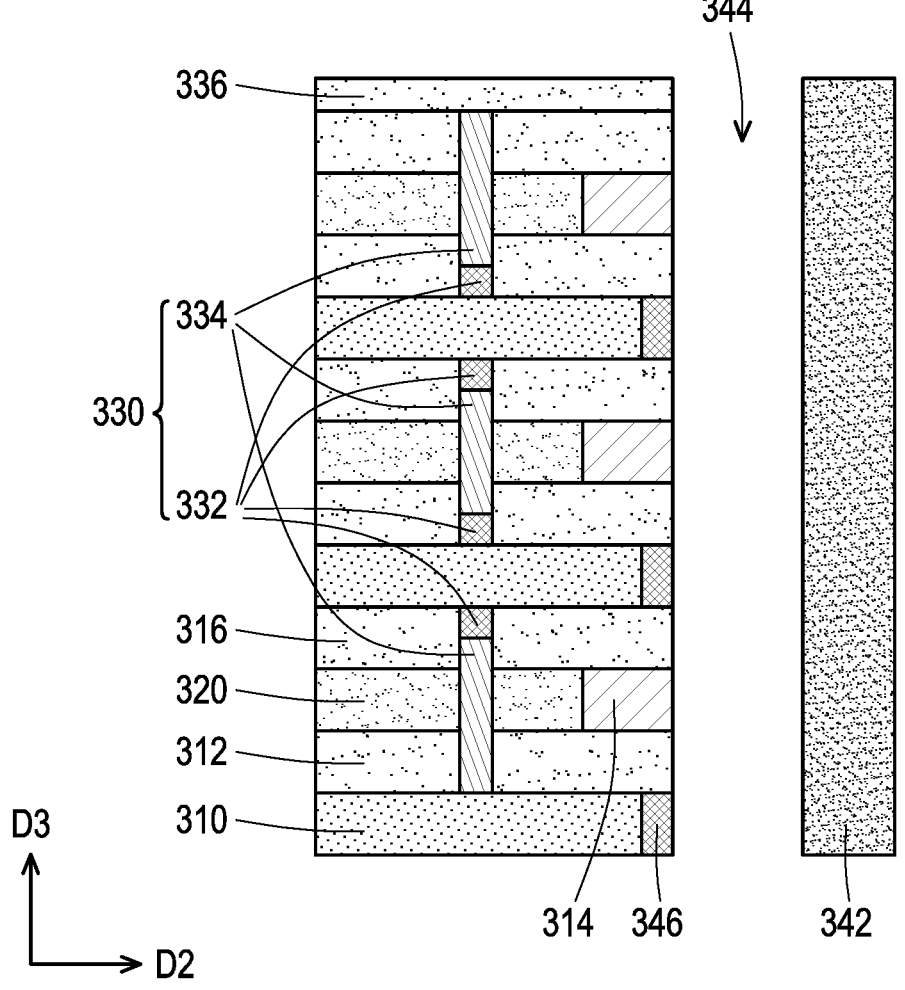
Figure 10H:
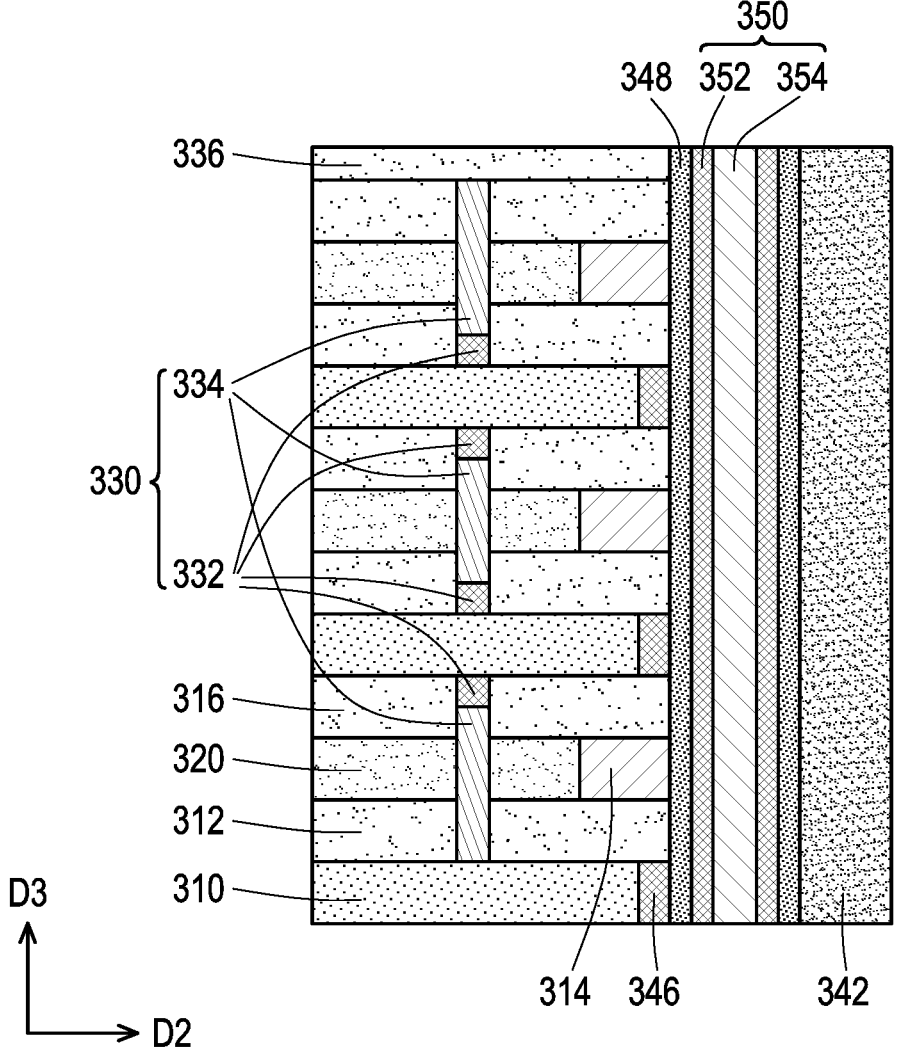
Figure 10I:
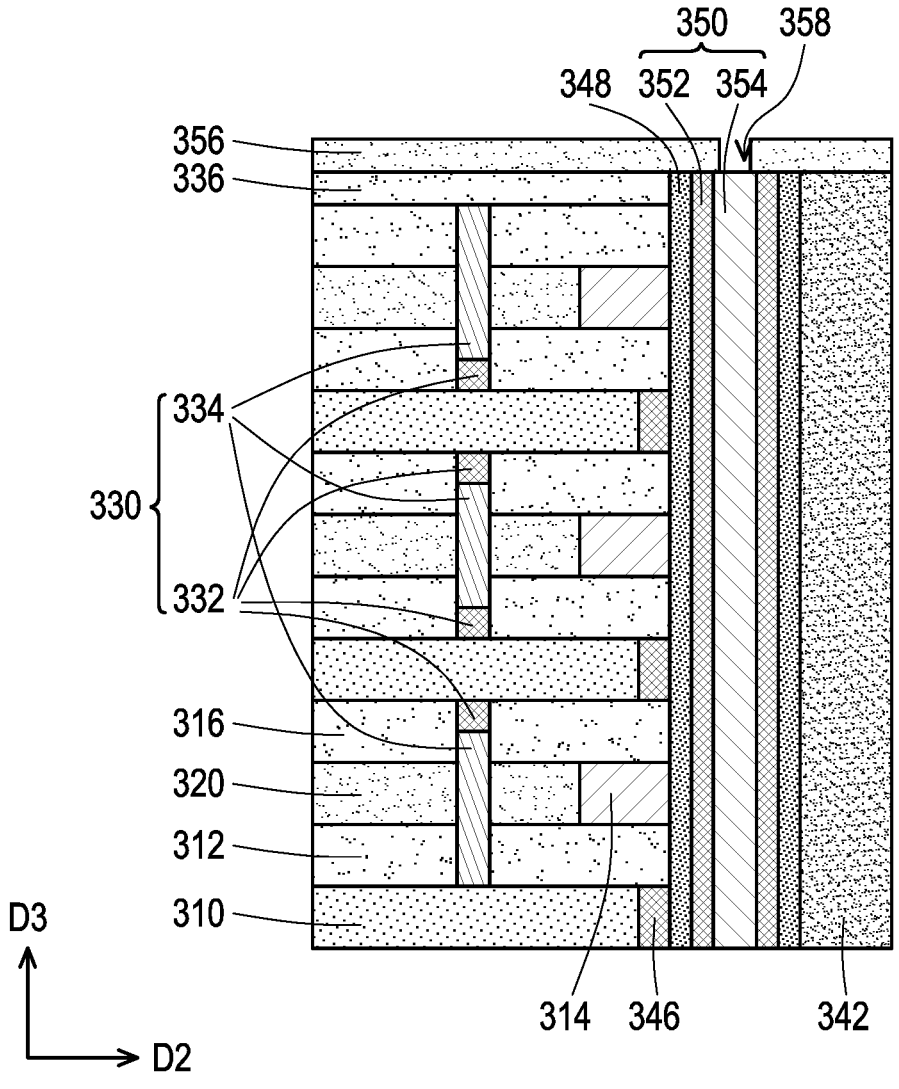
Figure 10J:
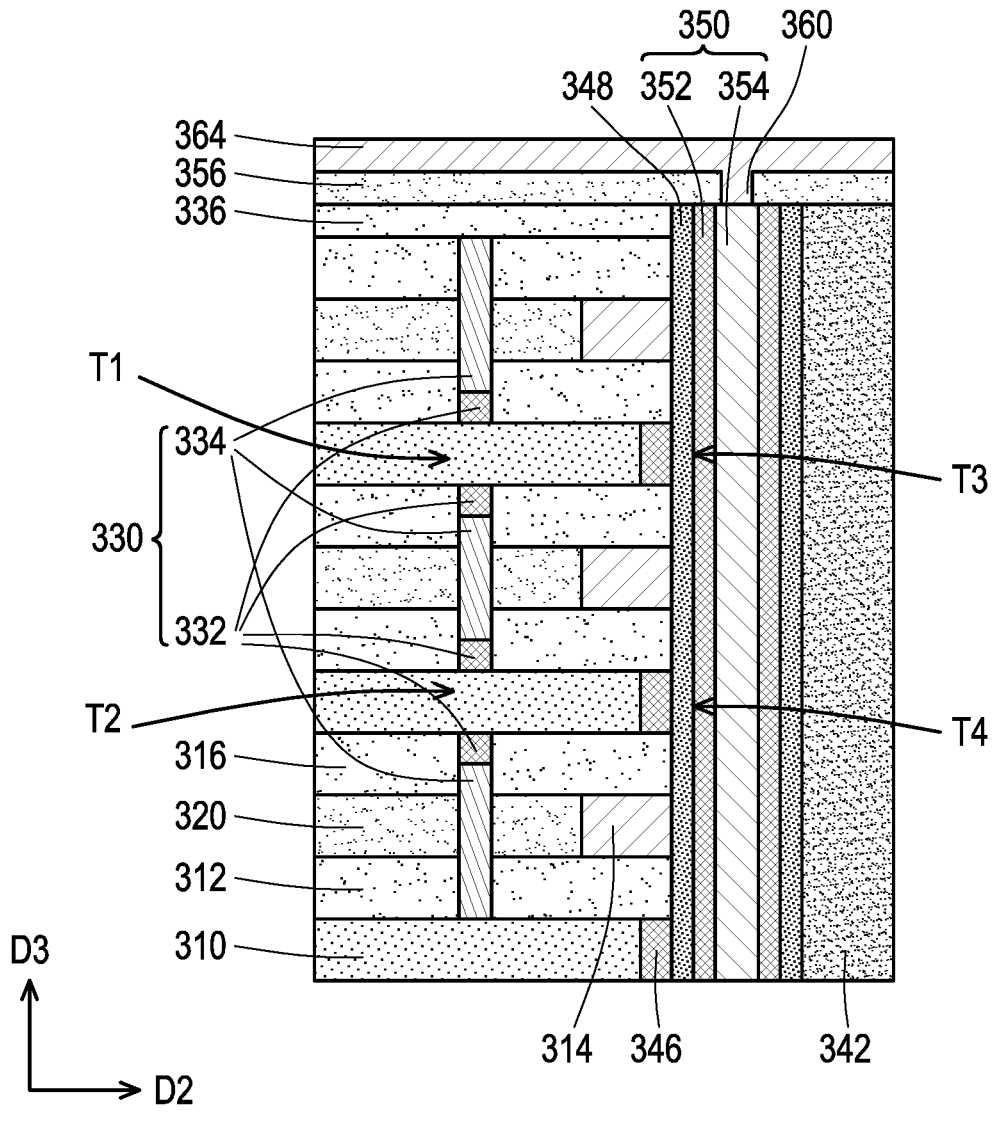
Figure 11:
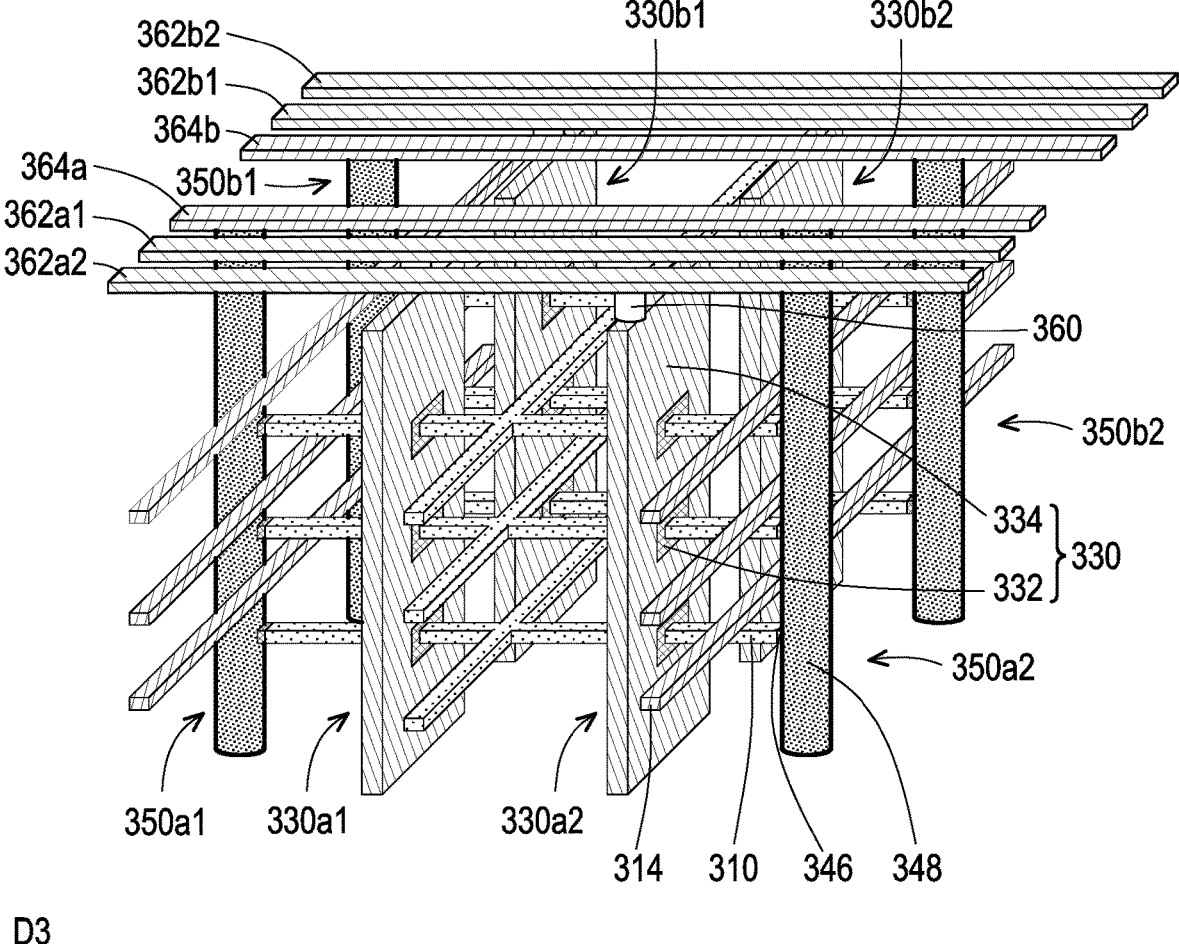
Figure 12:
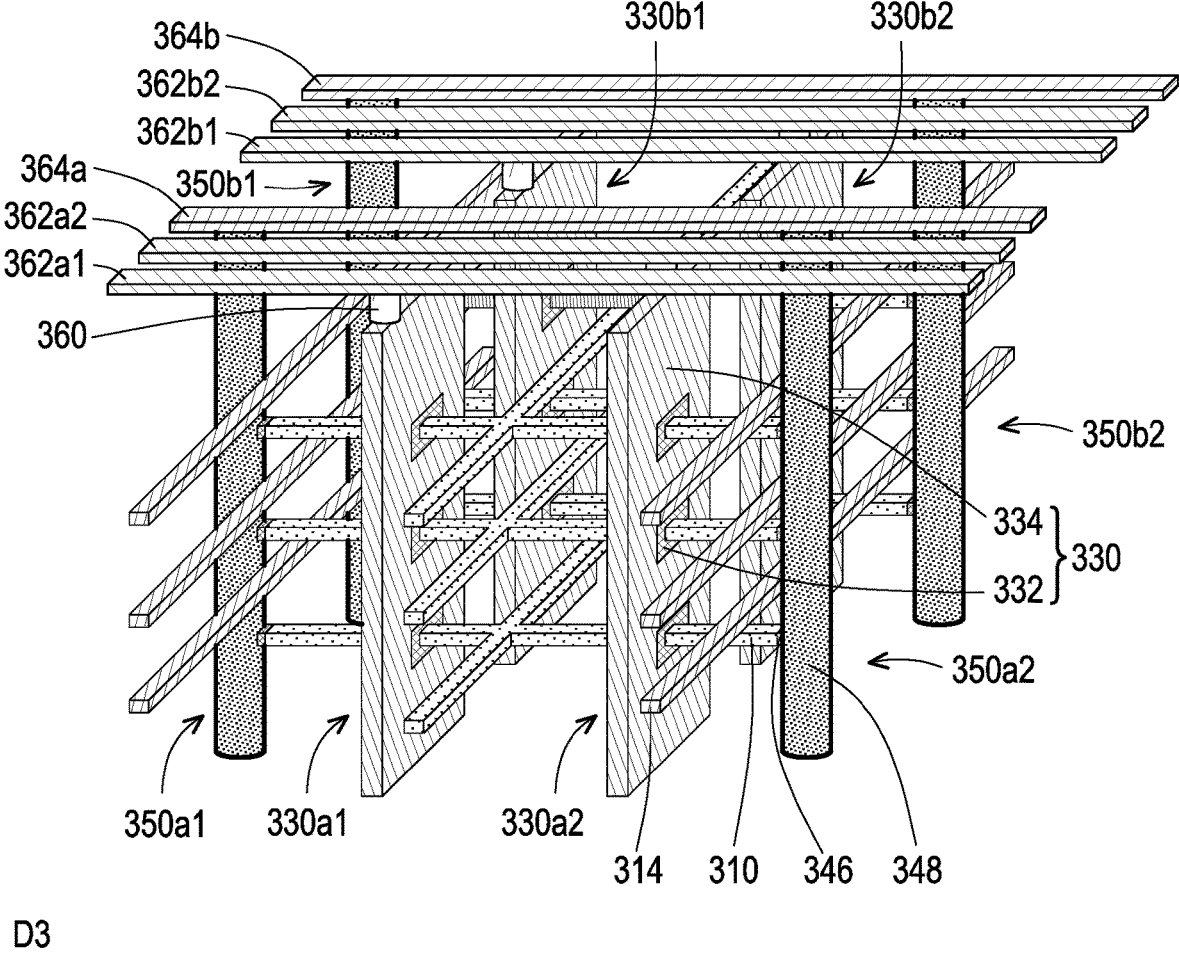
FIG. 12 illustrates a three dimensional view of a memory device in accordance with some embodiments.
Figure 13:
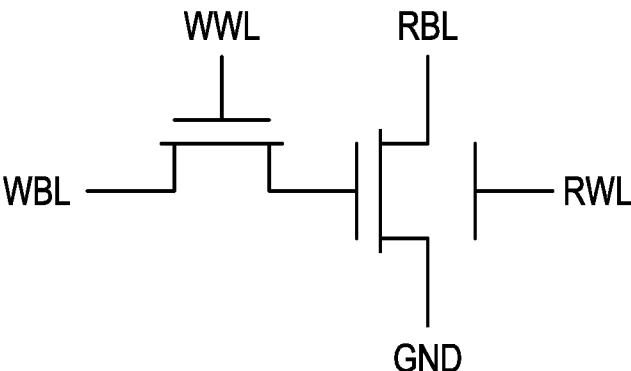
FIG. 13 is a circuit diagram of a memory device of FIG. 11 and FIG. 12.

FIG. 7A to FIG. 11 illustrate varying views of a method of forming a memory device in accordance with some embodiments. FIG. 7A to FIG. 7L illustrate top views of stages of forming a memory device. FIG. 8A to FIG. 8D illustrate cross-sectional views taken along lines I-I' of FIG. 7A to FIG. 7D, FIG. 9A to FIG. 9D illustrate cross-sectional views taken along line II-II' of FIG. 7C to FIG. 7G, and FIG. 10A to FIG. 10J illustrate cross-sectional views taken along line III-III' of FIG. 7G to FIG. 7L. FIG. 11 illustrates a three dimensional view of a memory device of FIG. 7L and FIG. 10J. FIG. 12 illustrates a three dimensional view of a memory device in accordance with some embodiments. FIG. 13 is a circuit diagram of a memory device of FIG. 11 and FIG. 12. According to some embodiments, the memory device may be a three-dimensional (3D) memory device. The memory devices depicted in the following paragraphs may be used as the memory devices 120 and 130 in FIG. 1.

Figure 7A:
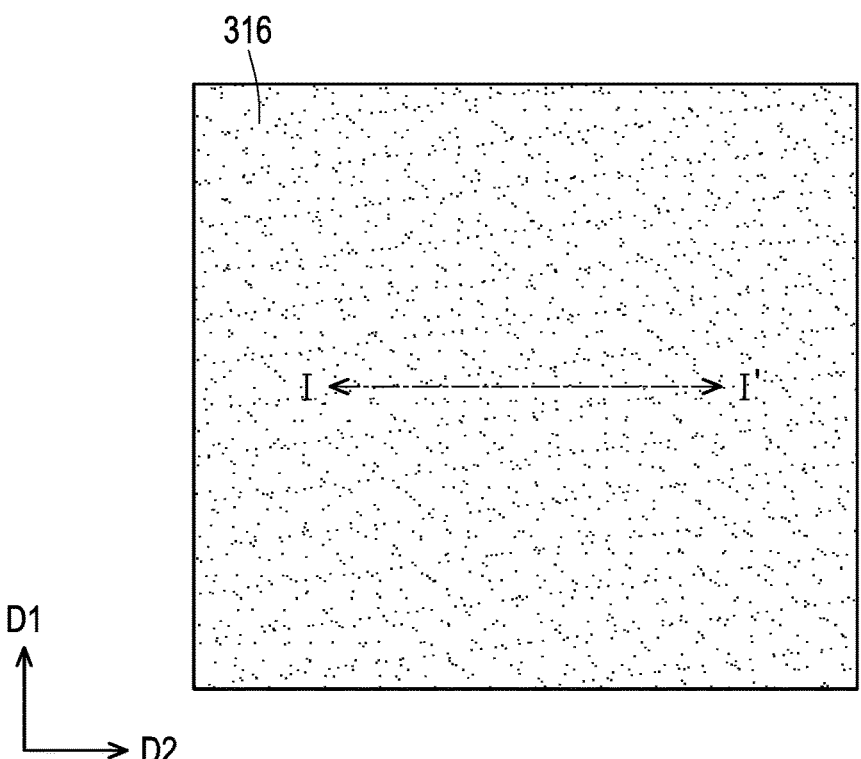
FIG. 7A to FIG. 11 illustrate varying views of a method of forming a memory device in accordance with some embodiments.
Figure 8A:
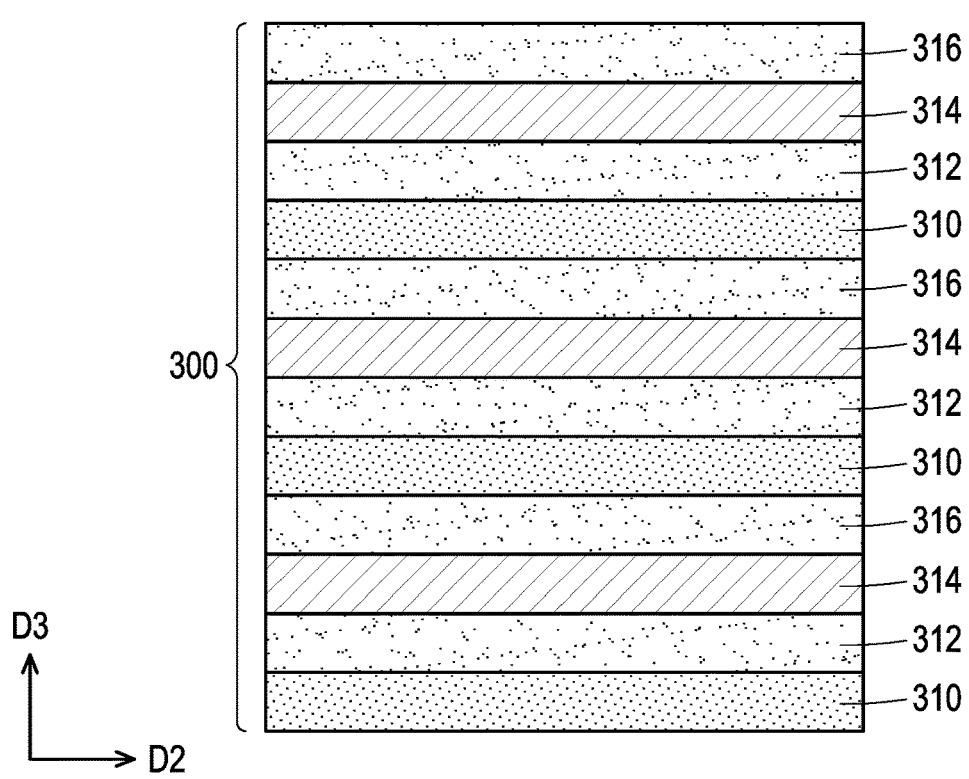

Referring to FIG. 7A and FIG. 8A, a multi-layer stack 300 is formed. In some embodiments, the multi-layer stack 300 includes a plurality of first semiconductor layers 310, a plurality of first dielectric layers 312, a plurality of first conductive layers 314 and a plurality of second dielectric layers 316. The first semiconductor layers 310, the first dielectric layers 312, the first conductive layers 314 and the second dielectric layers 316 are alternately stacked on one another. For example, the first semiconductor layer 310 and the first conductive layer 314 are respectively sandwiched between the first dielectric layers 312 and the second dielectric layers 316. In some embodiments, the first semiconductor layers 310, the first dielectric layers 312, the first conductive layers 314 and the second dielectric layers 316 are extended along a first direction D1 (e.g., Y direction) and a second direction D2 (e.g., X direction), and are alternately stacked in a third direction D3 (e.g., Z direction). The first direction D1, the second direction D2 and the third direction D3 are substantially perpendicular to one another. The first direction D1 and the second direction D2 are horizontal directions, and third direction D3 is a vertical direction, for example. In some embodiments, the topmost second dielectric layer 316 is also the topmost layer of the multi-layer stack 300.

In some embodiments, the first semiconductor layers 310 includes silicon, germanium, III-V semiconductor, IGZO, IZO, AZO, the like or a combination thereof. The semiconductor layer 310 may be formed by a deposition process such as ALD, CVD, PVD, or the like.

The first dielectric layer 312 and the second dielectric layer 316 have the same or different materials. In some embodiments, materials of the first dielectric layer 312 and the second dielectric layer 316 are not particularly limited, as long as said materials render good etching selectivity with respect to the first semiconductor layer 310 and the first conductive layer 314. For example, the etching selectivity between the first and second dielectric layers 312 and 316 and the first semiconductor layer 310 and the first conductive layer 314 ranges between 1:10 and 1:10000. Herein, the etching selectivity is denoted by a ratio between an etch rate of the first and second dielectric layers 312 and 316 and the first semiconductor layer 310 and the first conductive layer 314.

In some embodiments, the first dielectric layer 312 and the second dielectric layer 316 are formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In some embodiments, the first dielectric layer 312 and the second dielectric layer 316 are respectively made of a single layer having one of the foregoing materials. However, the disclosure is not limited thereto. In alternative embodiments, the first dielectric layer 312 and the second dielectric layer 316 are respectively made of a laminate structure of at least two of the foregoing materials.

In some embodiments, the first conductive layer 314 includes copper, titanium, titanium nitride, tantalum, tantalum nitride, tungsten, ruthenium, aluminum, combinations thereof, or the like. In some embodiments, the first conductive layer 314 is made by a single material such as TiN. In some embodiments, the first conductive layer 314 is a multi-layer structure. For example (not shown), the first conductive layer 314 includes two barrier layers and a metal layer between the barrier layers. Specifically, a barrier layer is disposed between the metal layer and the adjacent first dielectric layer 312 and second dielectric layer 316. The barrier layers may prevent the metal layer from diffusion to the adjacent first dielectric layer 312 and second dielectric layer 316. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers are formed of a first conductive material, such as a metal nitride, such as titanium nitride, tantalum nitride, molybdenum nitride, zirconium nitride, hafnium nitride, or the like. The metal layer may be formed of a second conductive material, such as a metal, such as tungsten, ruthenium, molybdenum, cobalt, aluminum, nickel, copper, silver, gold, alloys thereof, or the like. The barrier layers and metal layer may each be formed by an acceptable deposition process such as CVD, PVD, ALD, PECVD, or the like.

Figure 7B:
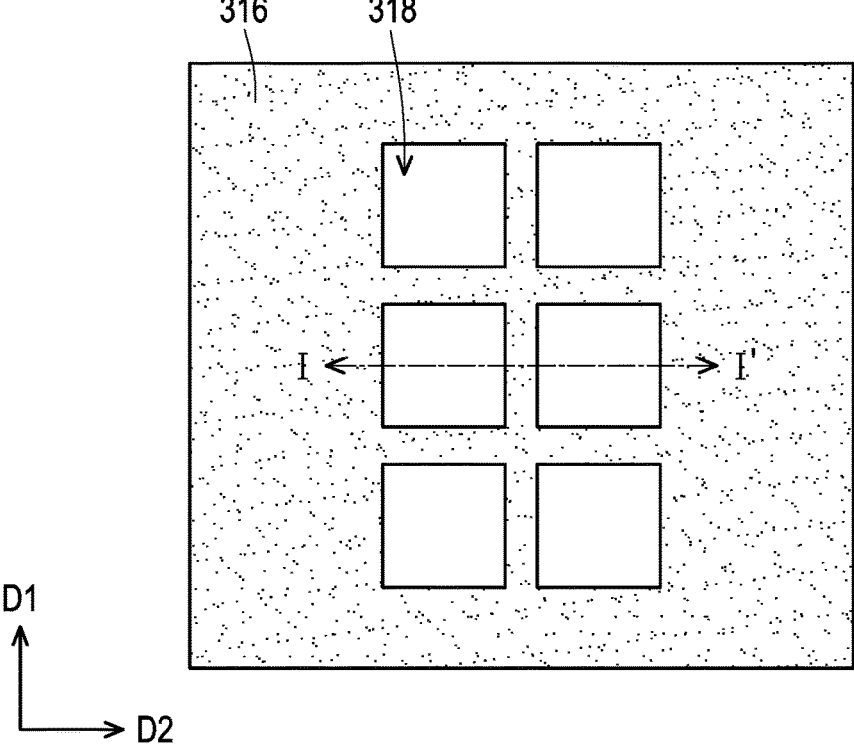
Figure 8B:
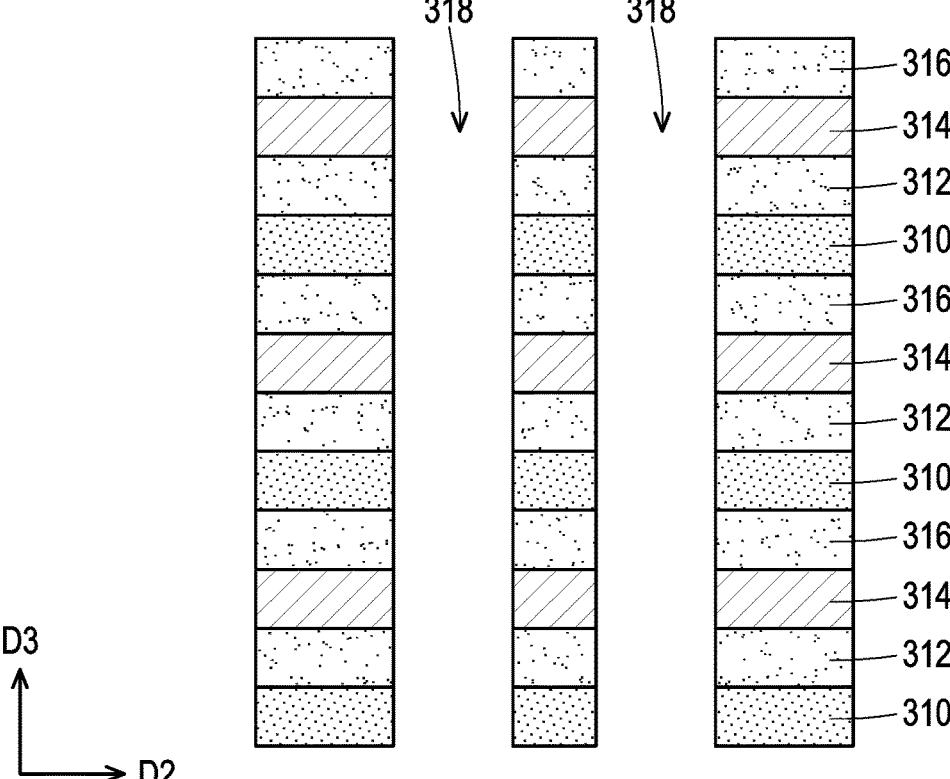

Referring to FIG. 7B and FIG. 8B, the multi-layer stack 300 is patterned, to form a plurality of openings 318. In some embodiments, by using a mask, the first semiconductor layers 310, the first dielectric layers 312, the first conductive layers 314 and the second dielectric layers 316 are partially removed. In some embodiments, the opening 318 penetrates through the multi-layer stack 300. As shown in FIG. 7B, the openings 318 are arranged in an array along the first direction D1 and the second direction D2. After partial removal, as shown in FIG. 7B, the second dielectric layers 316 is net-shaped, for example. Similarly, the first semiconductor layers 310, the first dielectric layers 312 the first conductive layers 314 are respectively net-shaped, for example.

Figure 7C:
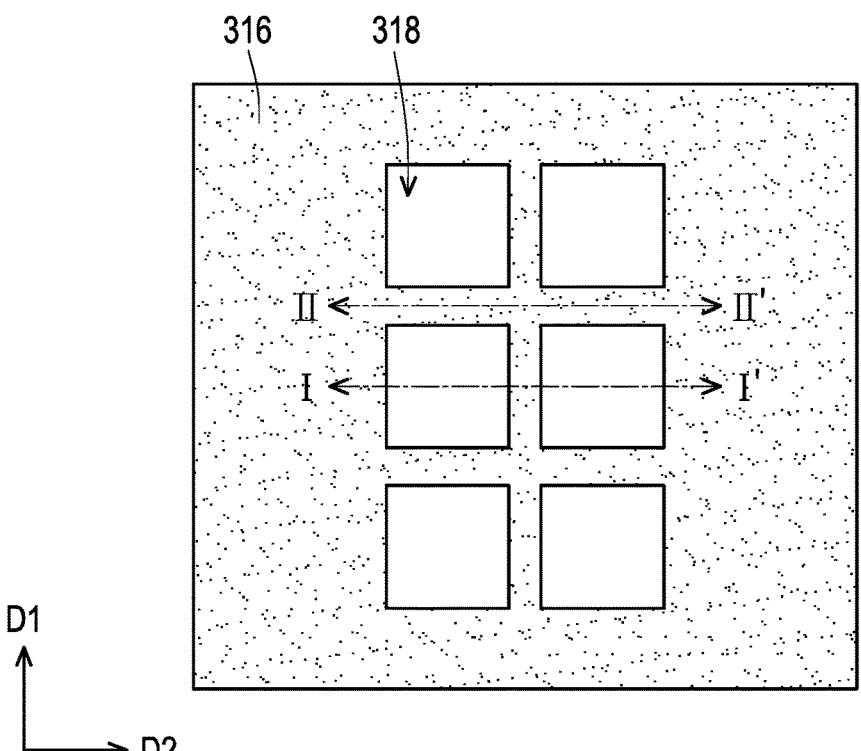
Figure 8C:
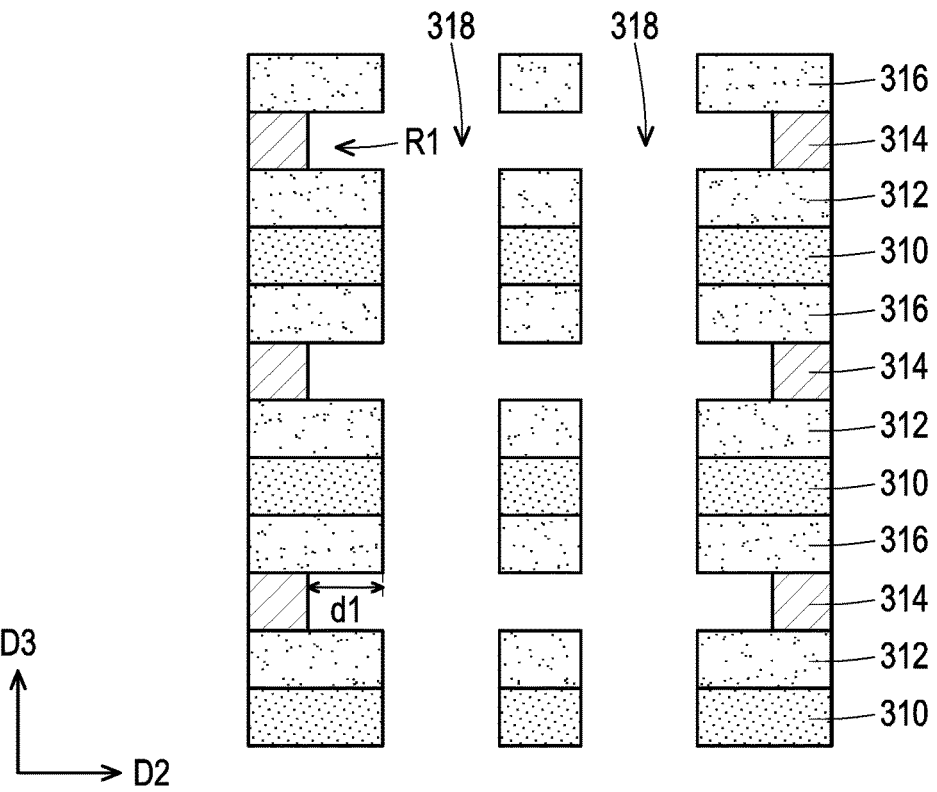

Referring to FIG. 7C, FIG. 8C and FIG. 9A, the first conductive layers 314 are laterally recessed through the openings 318 by using an etching process. In some embodiments, portions of the first conductive layers 314 exposed by the openings 318 are removed, and thus as shown in FIG. 8C, a plurality of recesses R1 are respectively formed between adjacent two of the first dielectric layers 312 and the second dielectric layers 316. The recess R1 exposes the underlying layer such as the first dielectric layer 312. In some embodiments, the recess R1 has a dimension d1 along the second direction D2. In some embodiments, as shown in FIG. 9A, the recess R1 is extended along the first direction D1. Thus, after partial removal, the first conductive layer 314 is extended along the first direction D1 and line-shaped (shown in FIG. 11). In some embodiments, the etching process includes a wet etching process by using a suitable etchant.

Figure 7D:
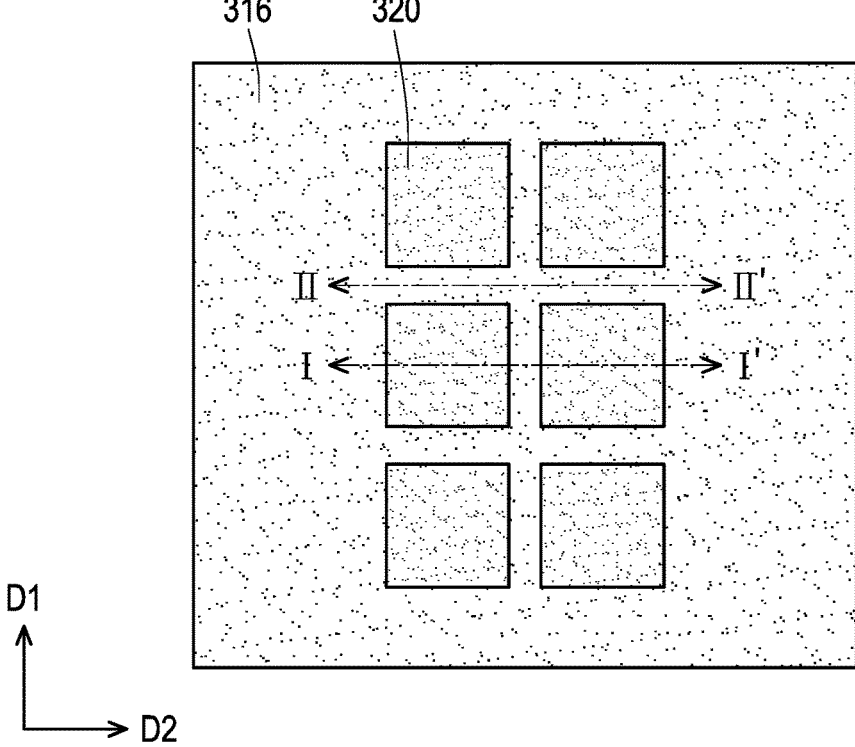
Figure 8D:
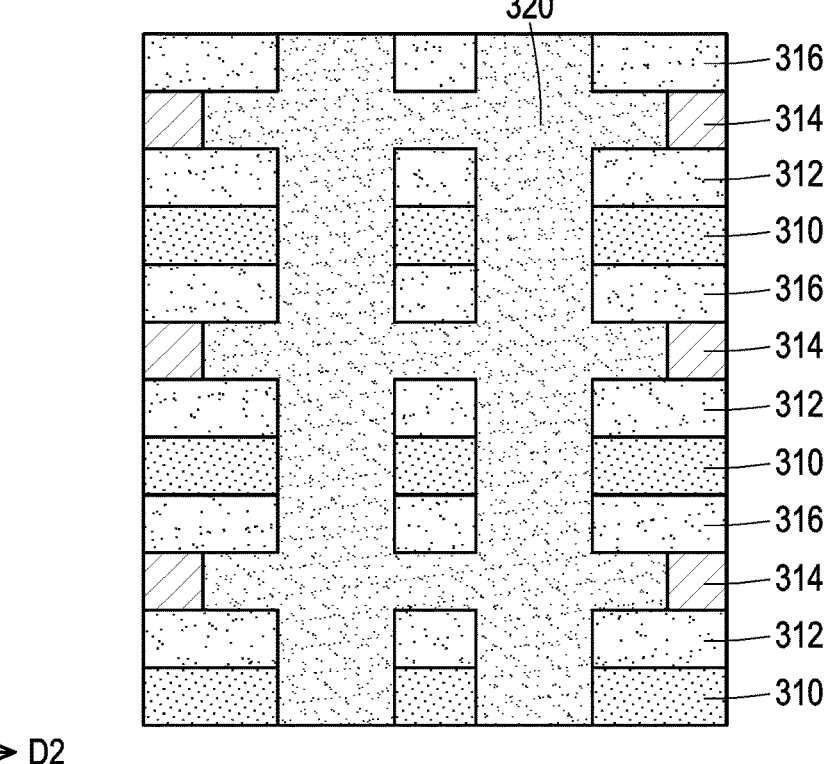

Referring to FIG. 7D, FIG. 8D and FIG. 9B, a plurality of dielectric layers 320 are respectively formed to fill up the openings 318 and the recesses R1. This step may be also referred to as a refill step. The dielectric layer 320 has a material the same as or different from the first and second dielectric layers 312 and 316, as long as said material renders good etching selectivity with respect to the first semiconductor layer 310 and the first conductive layer 314. In some embodiments, the dielectric layer 320 includes silicon oxide, silicon nitride, silicon oxynitride, phosphosilicate glass (PSG), borosilicate glass (BSG), boron-doped phosphosilicate glass (BPSG), or low-k materials. The dielectric layer 320 may be formed by depositing a dielectric material and performing a planarization (e.g., a CMP, etch back, or the like) to remove excess portions of the dielectric material outside the opening 318. In the resulting structure, top surfaces of the topmost dielectric layer 316 and the dielectric layer 320 may be substantially level (e.g., within process variations). In some embodiments, the dielectric layers 312, 316 and 320 are also referred to as ILD layers. In some embodiments in which the materials of the dielectric layers 312, 316 and 320 are the same, the interface does not exist between the dielectric layers 312, 316 and 320.

Figure 7E:
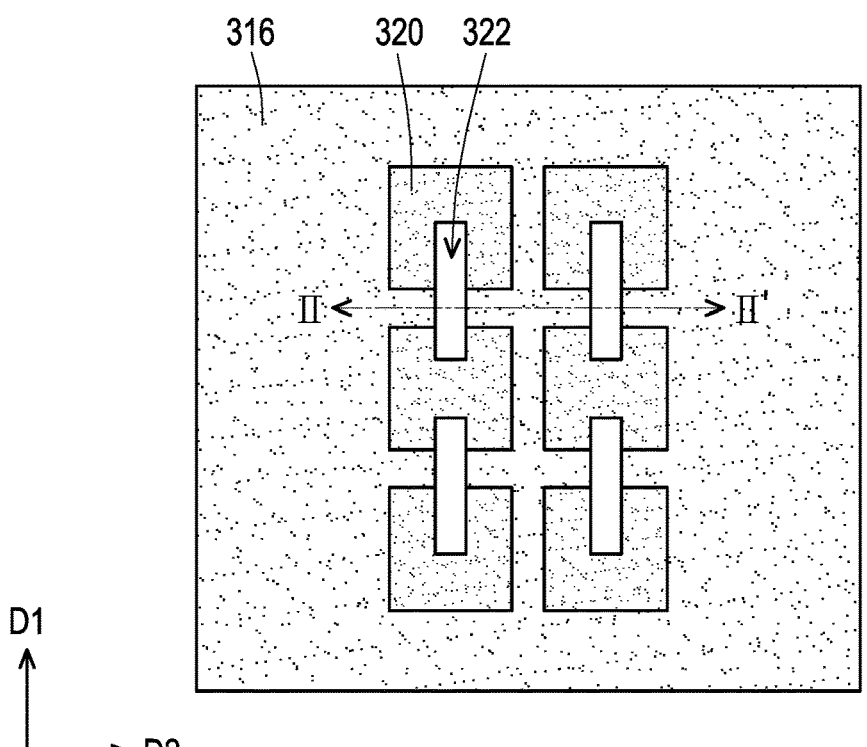

Referring to FIG. 7E and FIG. 9C, a plurality of openings 322 are formed to expose the stacked first semiconductor layers 310. The openings 322 are formed by removing portions of the dielectric layers 312, 316 and 320 surrounding the stacked first semiconductor layers 310, for example. In some embodiments, as shown in FIG. 9C, the openings 322 expose portions of the line-shaped first semiconductor layer 310 extended along the second direction D2.

Figure 7F:
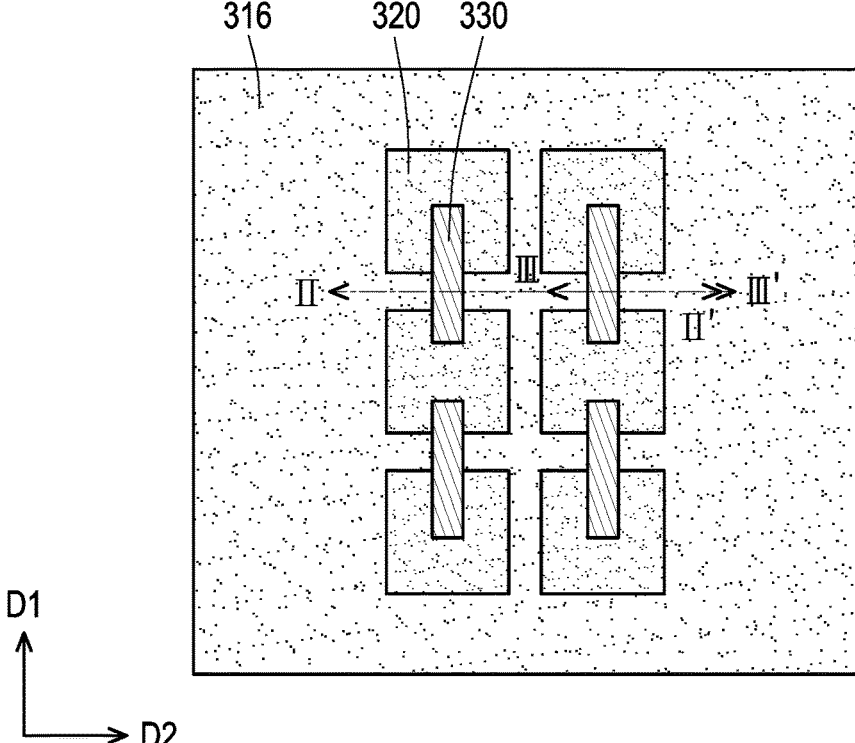

Referring to FIG. 7F and FIG. 9D, a plurality of first gates 330 are formed to fill up the openings 322. In some embodiments, a first gate dielectric layer 332 is formed on exposed surfaces of the stacked first semiconductor layers 310, and a first gate electrode 334 is formed to fill up the second opening 322. In some embodiments, as shown in FIG. 11, the first gate dielectric layer 332 and the first gate electrode 334 together wrap around the stacked first semiconductor layers 310. The first gate 330 has a gate all around (GAA) structure. In some embodiments, the first gate 330 is sheet-shaped. In some embodiments, as shown in FIG. 7F, the first gates 330 are arranged in an array along the first direction D1 and the second direction D2. As shown in FIG. 9D, the first gate 330 is electrically isolated from the first conductive layer 314 by the dielectric layers 312, 316 and 320, for example.

In some embodiments, the first gate dielectric layer 332 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In alternative embodiments, the first gate dielectric layer 332 includes metal oxides, metal nitrides, metal silicates, transition metal-oxides, transition metal-nitrides, transition metal-silicates, oxynitrides of metals, metal aluminates, or combinations thereof. For example, the first gate dielectric layer 332 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The first gate dielectric layer 332 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, the first gate electrode 334 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. The first gate electrode 334 may be formed by a deposition process such as ALD, CVD, PVD, or the like. In some embodiments, a barrier layer (not shown) is optionally formed between the first gate electrode 334 and the first gate dielectric layer 332, so as to avoid diffusion of atoms between elements. In some embodiments, the barrier material includes TiN, TaN, TiSiN, TaSiN, WSiN, TiC, TaC, TiAlC, TaAlC, TiAlN, TaAlN, or a combination thereof.

In some embodiments, after forming the first gates 330, a dielectric layer 336 is formed over the first gates 330. The dielectric layer 336 may entirely cover the top surfaces of the dielectric layer 316 and the first gates 330. A material of the dielectric layer 336 may be the same or different from the materials of the dielectric layers 312, 316 and 320. The dielectric layer 336 may include silicon oxide, silicon nitride, silicon oxynitride, phosphosilicate glass (PSG), borosilicate glass (BSG), boron-doped phosphosilicate glass (BPSG), or low-k materials. In some embodiments, the dielectric layers 312, 316, 320 and 336 together surround the first gates 330, in other words, the first gates 330 are disposed in the dielectric layers 312, 316, 320 and 336. In some embodiments, the dielectric layers 312, 316, 320 and 336 are also referred to as ILD layers. In some embodiments in which the materials of the dielectric layers 312, 316, 320 and 336 are the same, the interface does not exist between the dielectric layers 312, 316, 320 and 336.

FIG. 10A illustrates a cross-sectional view taken along line III-III' of FIG. 7F, showing a region at one side of the first gate 330. As shown in FIG. 10A, portions of the first semiconductor layer 310 and the first conductive layers 314 are respectively extended along the second direction D2 and line-shaped, for example.

Figure 7G:
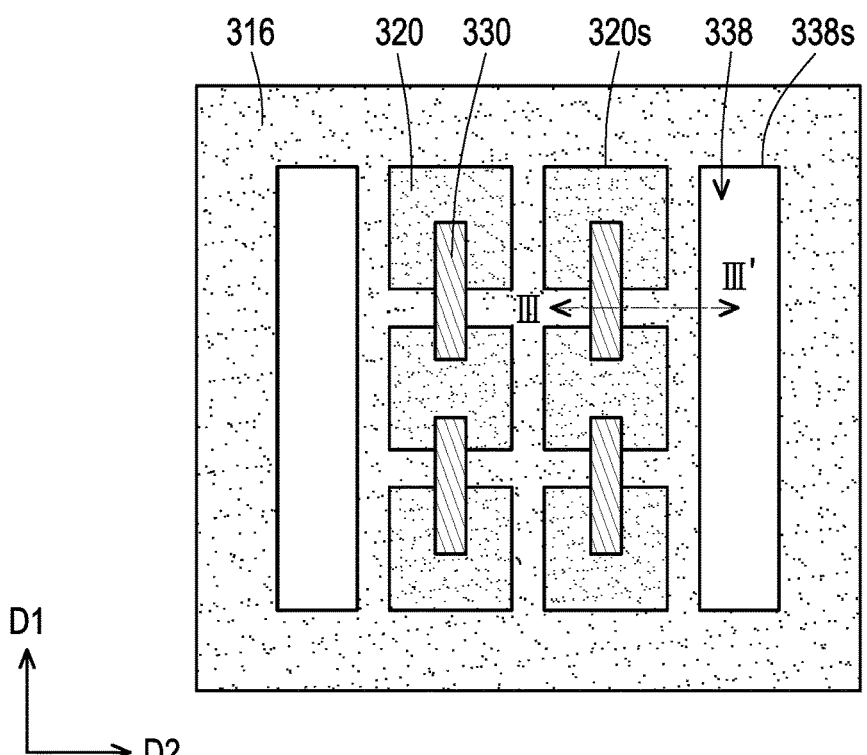

Referring to FIG. 7G and FIG. 10B, a plurality of openings 338 are formed by partially removing the first semiconductor layers 310, the first conductive layers 314 and the dielectric layers 312, 316 and 336. As shown in FIG. 10B, the opening 338 penetrates through the first semiconductor layers 310, the first conductive layers 314 and the dielectric layers 312, 316 and 336, and exposes sidewalls of the first semiconductor layers 310, the first conductive layers 314 and the dielectric layers 312, 316 and 336.

As shown in FIG. 7G, the openings 338 are respectively disposed at one side of the first gates 330 and extended along the first direction D1. For example, the opening 338 (on right of FIG. 7G) is at a first side (e.g., right side) of the respective first gates 330, and the opening 338 (on left of FIG. 7G) is at a second side (e.g., left side) of the respective first gates 330. In such embodiments, the first gates 330 are disposed between the opening 338. In some embodiments, as shown in FIG. 7G, a sidewall 338s of the opening 338 is substantially aligned with a sidewall 320s of the dielectric layer 320.

Referring to FIG. 7G and FIG. 10C, the first semiconductor layers 310 are laterally recessed through the openings 338 by using an etching process. In some embodiments, portions of the first semiconductor layers 310 exposed by the openings 338 are removed, and thus as shown in FIG. 10C, a plurality of recesses R2 are respectively formed between adjacent two of the dielectric layers 312, 316. In some embodiments, the recess R2 has a dimension d2 along the second direction D2. In some embodiments, the etching process includes a wet etching process by using a suitable etchant.

Figure 7H:
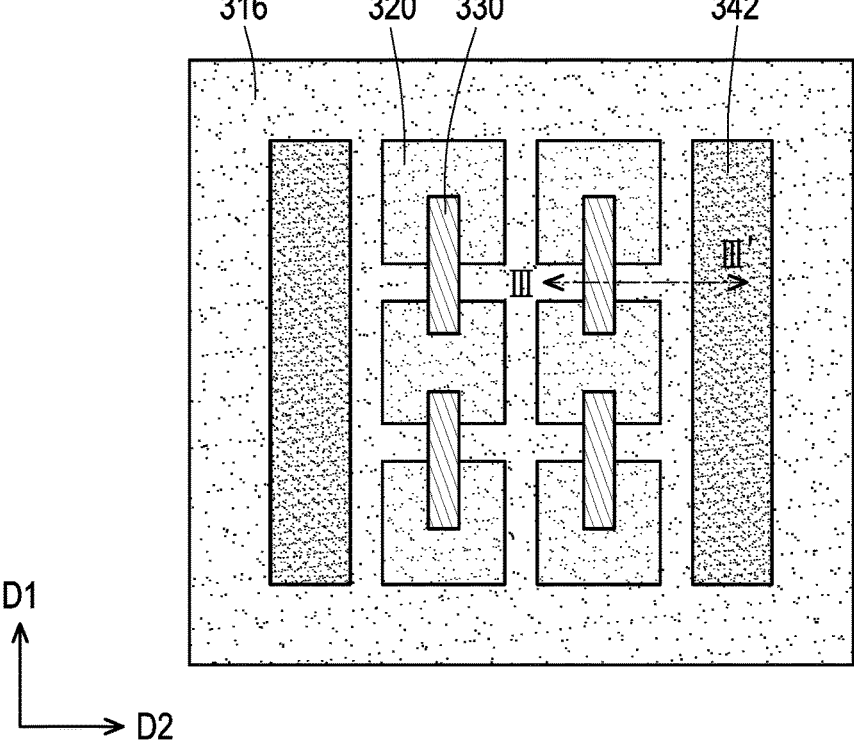

Referring to FIG. 7H and FIG. 10D, a plurality of dummy dielectric layers 340 are respectively formed in the recesses R2, and a plurality of dielectric layers 342 are respectively formed in the openings 338 to fill up the openings 338. A material of the dielectric layer 342 may be the same or different from the materials of the dielectric layers 312, 316, 320 and 336. The dielectric layer 342 may include silicon oxide, silicon nitride, silicon oxynitride, phosphosilicate glass (PSG), borosilicate glass (BSG), boron-doped phosphosilicate glass (BPSG), or low-k materials. In some embodiments, a material of the dummy dielectric layer 340 is not particularly limited, as long as said material renders good etching selectivity with respect to the dielectric layer 342. In some embodiments, the dummy dielectric layer 340 includes silicon oxide such as low temperature oxide (LTO), silicon nitride, silicon oxynitride, high-k dielectrics, or a combination thereof. The dummy dielectric layer 340 may be formed by suitable fabrication techniques such as ALD, CVD, or combinations thereof.

Figure 7I:
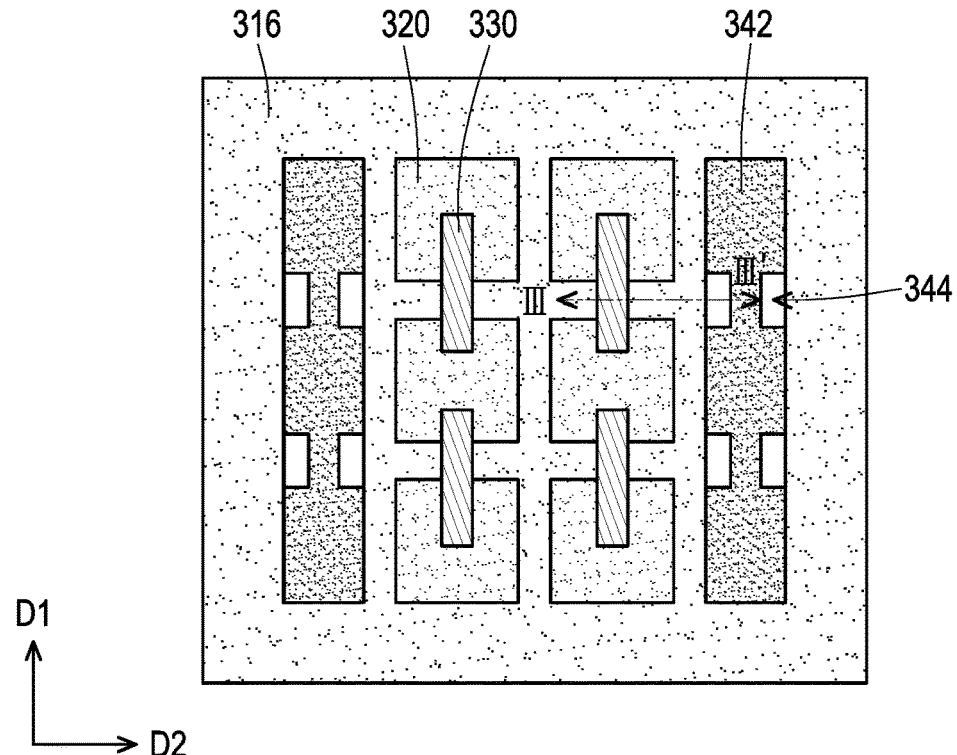

Referring to FIG. 7I and FIG. 10E, a plurality of openings 344 are formed in the dielectric layers 342. In some embodiments, the opening 344 is formed by partially removing the dielectric layer 342. As shown in FIG. 10E, the opening 344 penetrates through the dielectric layer 342, to expose sidewalls of the dummy dielectric layers 340, the first semiconductor layers 310, the first conductive layers 314 and the dielectric layers 312, 316, and 336. As shown in FIG. 7I, the openings 344 are respectively disposed at one side (e.g., sidewall or edge) of the dielectric layer 342. In FIG. 7I, there are four openings 344 illustrated in the dielectric layer 342. However, the number of the openings 344 is not limited, as long as they are separated from each other and respectively expose the dummy dielectric layers 340, the first semiconductor layers 310 and the first conductive layers 314.

Referring to FIG. 10E, then, the dummy dielectric layers 340 are removed through the openings 344. In some embodiments, the dummy dielectric layers 340 exposed by the openings 344 are entirely removed, and thus as shown in FIG. 10F, a plurality of recesses R3 are formed. In some embodiments, the recess R3 has a dimension d3 along the second direction D2 corresponding to the dimension d2 of the recess R2. In some embodiments, the etching process includes a wet etching process by using a suitable etchant.

Referring to FIG. 10G, a plurality of dielectric layers 346 are formed in the recesses R3. In some embodiments, the dielectric layers 346 are respectively formed in the recesses R3, to fill up the recesses R3. Materials of the dielectric layers 346 may be the same as or similar to those described with respect to the first gate dielectric layer 332 or any suitable dielectric material. In some embodiments, the material of the dielectric layers 346 is the same as the material of the first gate dielectric layer 332.

Figure 7J:
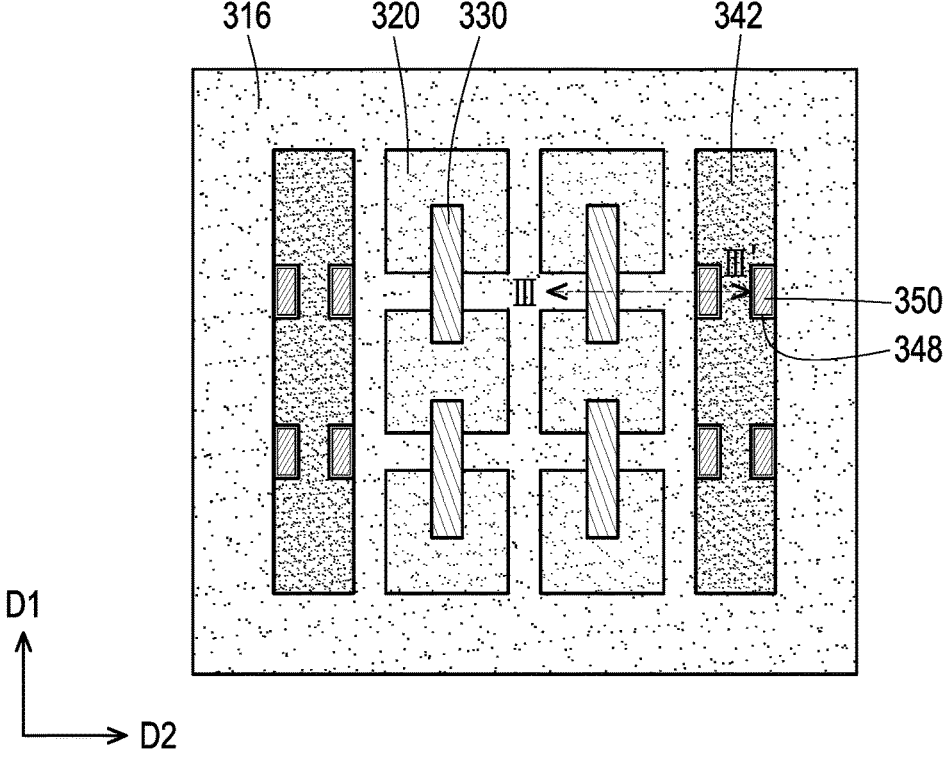

Referring to FIG. 7J and FIG. 10H, a plurality of second semiconductor layers 348 are respectively formed along sidewalls of the openings 344, and a plurality of second gates 350 are respectively formed to fill up the openings 344. In some embodiments, the second semiconductor layers 348 are formed along the sidewalls of the first semiconductor layers 310, the first conductive layers 314 and the dielectric layers 312, 316 and 336. In some embodiments, the second semiconductor layer 348 includes silicon, germanium, III-V semiconductor, IGZO, IZO, AZO, the like or a combination thereof. The second semiconductor layer 348 may be formed by a deposition process such as ALD, CVD, PVD, or the like.

In some embodiments, the second gate 350 includes a second gate dielectric layer 352 on the second semiconductor layer 348, and a second gate electrode 354 filling up the opening 344. The semiconductor layer 348, the second gate dielectric layer 352 and the second gate electrode 354 may be formed by sequentially depositing a semiconductor material, a dielectric material and a conductive material and performing a planarization (e.g., a CMP, etch back, or the like) to remove excess portions of the semiconductor material, the dielectric material and the conductive material outside the opening 344. In the resulting structure, top surfaces of the topmost dielectric layer 336, the semiconductor layer 348, the second gate dielectric layer 352, the second gate electrode 354, and the dielectric layer 342 may be substantially level (e.g., within process variations). In some embodiments, the second semiconductor layer 348 and the second gate 350 are extended along the third direction D3 while the first conductive layer 314 is extended along the first direction D1. In some embodiments, the first gate 330 is disposed at a first side of the stacked first conductive layers 314, and the second gate 350 is disposed at a second side opposite to the first side of the stacked first conductive layers 314.

In some embodiments, the second gate dielectric layer 352 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In alternative embodiments, the second gate dielectric layer 352 includes metal oxides, metal nitrides, metal silicates, transition metal-oxides, transition metal-nitrides, transition metal-silicates, oxynitrides of metals, metal aluminates, or combinations thereof. For example, the second gate dielectric layer 352 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The second gate dielectric layer 352 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, the second gate electrode 354 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. The second gate electrode 354 may be formed by a deposition process such as ALD, CVD, PVD, or the like. In some embodiments, a barrier layer (not shown) is optionally formed between the second gate electrode 354 and the second gate dielectric layer 352, so as to avoid diffusion of atoms between elements. In some embodiments, the barrier material includes TiN, TaN, TiSiN, TaSiN, WSiN, TiC, TaC, TiAlC, TaAlC, TiAlN, TaAlN, or a combination thereof.

Figure 7K:
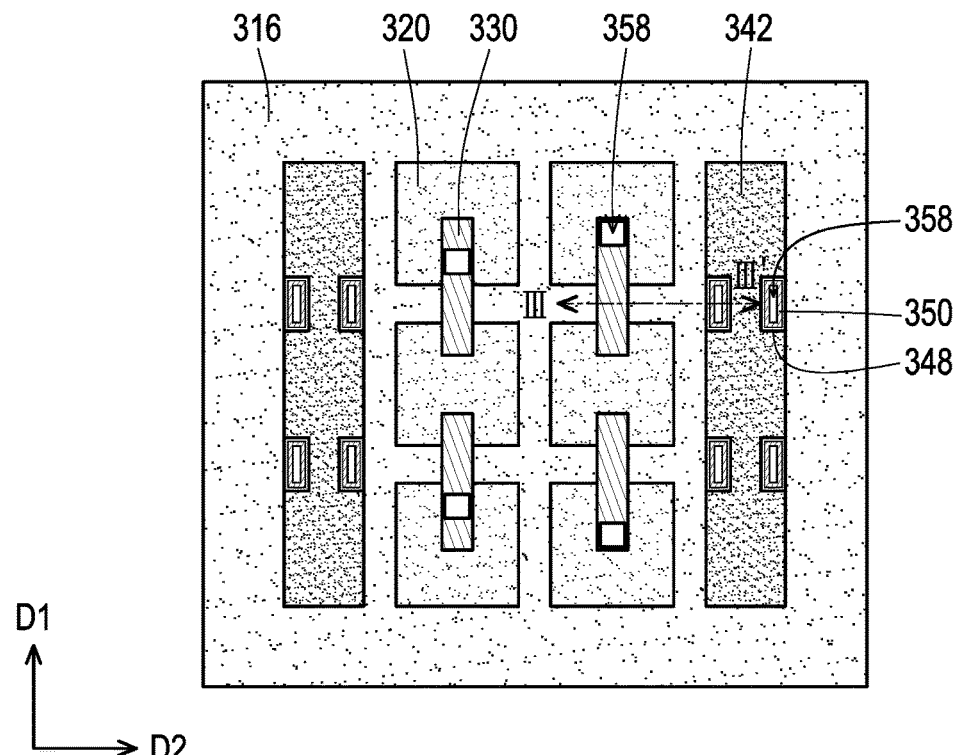

Referring to FIG. 7K and FIG. 10I, a dielectric layer 356 is formed over the second gates 350. In some embodiments, the dielectric layer 356 is formed over the second gates 350 and the dielectric layers 326 and 342. A material of the dielectric layer 356 may be the same or different from the materials of the dielectric layers 312, 316, 320, 336 and 342. The dielectric layer 356 may include silicon oxide, silicon nitride, silicon oxynitride, phosphosilicate glass (PSG), borosilicate glass (BSG), boron-doped phosphosilicate glass (BPSG), or low-k materials.

Then, as shown in FIG. 7K and FIG. 10I, a plurality of openings 358 are formed in the dielectric layer 356 to expose portions of the first gates 330 and the second gates 350. As shown in FIG. 10I, the openings 358 exposing the second gates 350 are formed by removing portions of the dielectric layer 356 respectively on the second gates 350. Similarly, the openings 358 exposing the first gates 330 may be formed by removing portions of the dielectric layers 336 and 356 respectively on the first gates 330. In some embodiments, a size of the opening 358 is not larger than a size of the corresponding first gate 330 or second gate 350, as shown in FIG. 10I.

Figure 7L:
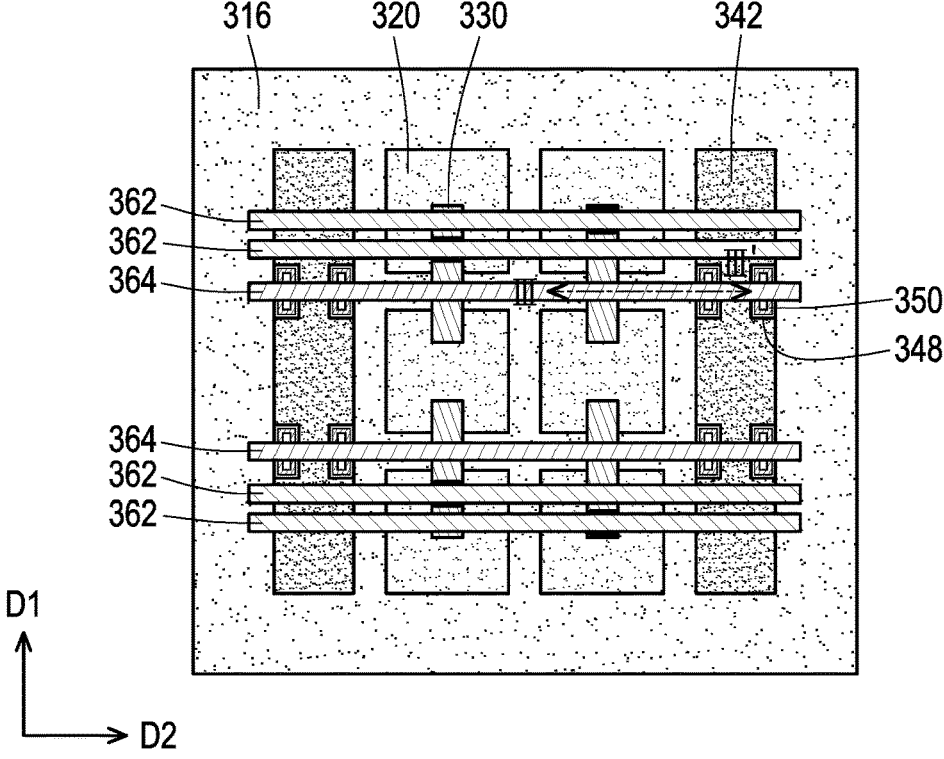

Referring to FIG. 7L, FIG. 10J and FIG. 11, a plurality of conductive lines 362 are formed to electrically connect to the first gates 330, and a plurality of conductive lines 364 are formed to electrically connect to the second gates 350. In some embodiments, the conductive lines 362, 364 are electrically connected to the first and second gates 350 through contacts 360 therebetween. The contacts 360 are respectively formed in the openings 358, for example. In some embodiments, the contacts 360 are integrally formed with the conductive lines 362, 364. However, the disclosure is not limited thereto. The contact 360 may be formed separately from the conductive lines 362, 364 thereover.

In some embodiments, as shown in FIG. 7L and FIG. 11, a plurality of first gates 330a1-330b2 are arranged to form a plurality of columns along the first direction D1 and in a plurality of rows along the second direction D2, and a plurality of second gates 350a1-350b2 are respectively disposed aside the first gates 330a1-330b2. For example, the first gates 330a1 and 330b1 are arranged in the same column (e.g., first column) along the first direction D1, and the first gates 330a2 and 330b2 are arranged in the same column (e.g., second column) along the first direction D1, the first gates 330a1 and 330a2 are arranged in the same row (e.g., first row) along the second direction D2, the first gates 330b1 and 330b2 are arranged in the same row (e.g., second row) along the second direction D2. Similarly, the second gates 350a1 and 350b1 are arranged in the same column (e.g., first column) along the second direction D1, and the second gates 350a2 and 350b2 are arranged in the same column (e.g., second column) along the second direction D1, the second gates 350a1 and 350a2 are arranged in the same row (e.g., first row) along the second direction D2, the second gates 350b1 and 350b2 are arranged in the same row (e.g., second row) along the second direction D2.

In some embodiments, the conductive lines 362a1-362b2 may be respectively electrically connected to the first gates 330a1-330b2. The conductive line 364a may be electrically connected to a plurality of second gates 350a1, 350a2 arranged in the same row (e.g., first row) along the second direction D2, and the conductive line 364b may be electrically connected to a plurality of second gates 350b1, 350b2 arranged in the same row (e.g., second row) along the second direction D2. In some embodiments, the conductive lines 364 and 364b are arranged between the conductive lines 362a1-362b2. However, the disclosure is not limited thereto. The conductive lines 362a1-362b2, 364a and 364b may have any suitable arrangement. For example, in FIG. 12, the conductive line 362a1, the conductive line 362a2, the conductive line 364a, the conductive line 362b1, the conductive line 362b2 and the conductive line 364b are arranged in order along the first direction D1. In such embodiments, the location of the second electrodes 350a1-350b2 with respect to the first electrodes 330a1-330b2 is different from that of FIG. 11.

In some embodiments, as shown in FIG. 10J and FIG. 13, the first gate 330 is electrically connected to a write word line WWL, the second gate 330 is electrically connected to a read word line RWL, the first semiconductor layer 310 is electrically coupled to a write bit line WBL, and the first conductive layer 314 is electrically coupled to a read bit line RBL. The first gate 330 may serve as a top gate, the second gate 350 may serve as a back gate, the middle one of the first conductive layers 314 may serve as a drain, others of the first conductive layers 314 may serve as sources, and the first and second semiconductor layers 310 may serve as channel layers. Accordingly, a plurality of transistors are formed for writing, storing and reading. For example, two transistors T1 and T2 are formed for writing, two transistors T3 and T4 are formed for storing, and transistor(s) using the second gate 350 as a back gate is formed for reading. In some embodiments, the above configuration is applied for a 3D gain cell of a memory device such as high density embedded DRAM (eDRAM).

Figure 14:
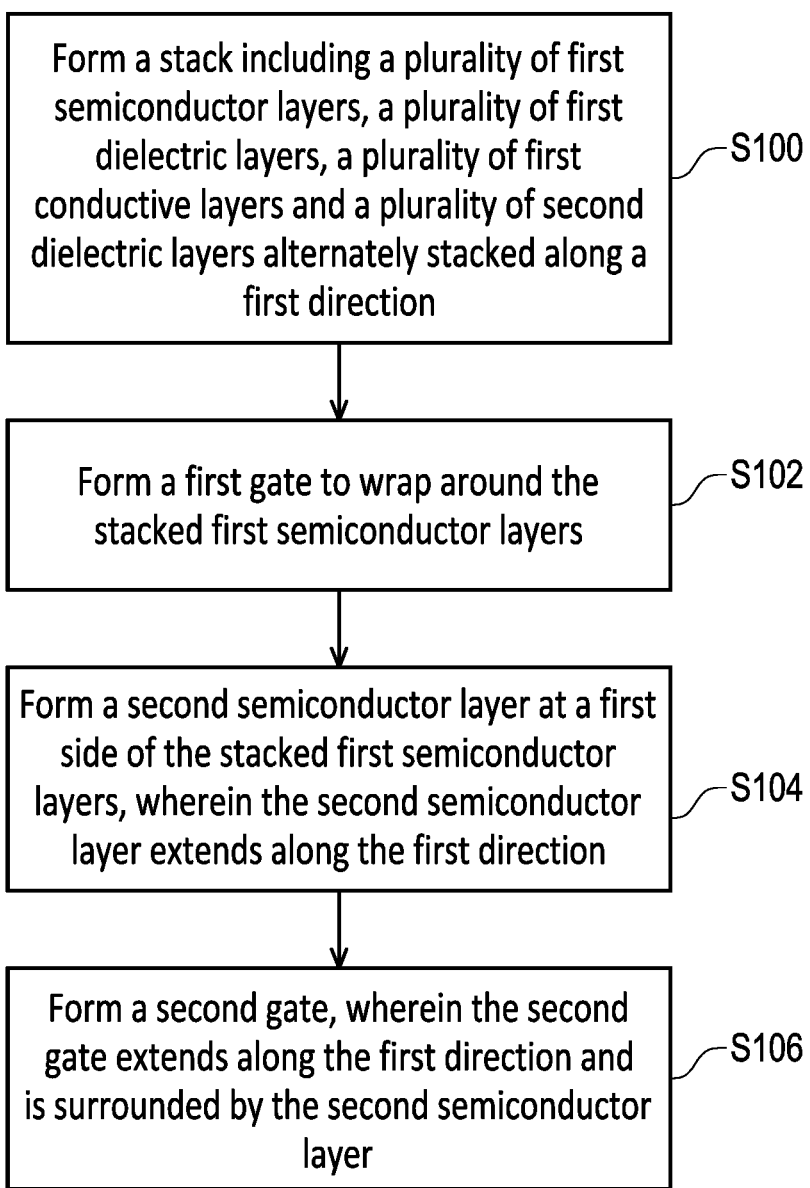
FIG. 14 illustrates a method of forming a semiconductor device in accordance with some embodiments of the present disclosure.

FIG. 14 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S100, a stack is formed, and the stack includes a plurality of first semiconductor layers, a plurality of first dielectric layers, a plurality of first conductive layers and a plurality of second dielectric layers alternately stacked along a first direction. FIG. 7A and FIG. 8A illustrate views corresponding to some embodiments of act S100.

At act S102, a first gate is formed to wrap around the stacked first semiconductor layers. FIG. 7F, FIG. 9D and FIG. 11 illustrate views corresponding to some embodiments of act S102.

At act S104, a second semiconductor layer is formed at a first side of the stacked first semiconductor layers, wherein the second semiconductor layer extends along the first direction. FIG. 7J, FIG. 10H and FIG. 11 illustrate views corresponding to some embodiments of act S104.

At act S106, a second gate is formed, wherein the second gate extends along the first direction and is surrounded by the second semiconductor layer. FIG. 7J, FIG. 10H and FIG. 11 illustrate views corresponding to some embodiments of act S106.

In accordance with some embodiments of the disclosure, a semiconductor device includes a first conductive line, a second conductive line, a third conductive line, a first semiconductor layer, a memory layer and a conductive layer. The first conductive line and the second conductive line extend along a first direction. The third conductive line extends along a second direction substantially perpendicular to the first direction. The first semiconductor layer extends along the second direction to surround the third conductive line. The memory layer is disposed between the first semiconductor layer and the second conductive line. The conductive layer is disposed between the memory layer and the first semiconductor layer.

In accordance with some embodiments of the disclosure, a semiconductor device includes a plurality of first semiconductor layers, a first gate, a second gate and a second semiconductor layer. The first semiconductor layers respectively extend along a first direction and are stacked along a second direction substantially perpendicular to the first direction. The first gate wraps around the first semiconductor layers and extends along the second direction. The second gate extends along the second direction. The second semiconductor layer extends along the second direction and is disposed between the second gate and the first semiconductor layers.

In accordance with some embodiments of the disclosure, a method of forming a semiconductor device is as follows. A stack is formed, and the stack includes a plurality of first semiconductor layers, a plurality of first dielectric layers, a plurality of first conductive layers and a plurality of second dielectric layers alternately stacked along a first direction. A first gate is formed to wrap around the stacked first semiconductor layers. A second semiconductor layer is formed at a first side of the stacked first semiconductor layers, wherein the second semiconductor layer extends along the first direction. A second gate is formed, wherein the second gate extends along the first direction and is surrounded by the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first conductive line and a second conductive line, respectively extending along a first direction;
   a third conductive line, extending along a second direction substantially perpendicular to the first direction;
   a first semiconductor layer, extending along the second direction to surround the third conductive line;
   a memory layer, disposed between the first semiconductor layer and the second conductive line; and
   a conductive layer, disposed between the memory layer and the first semiconductor layer.

2. The semiconductor device of claim 1, further comprising a dielectric layer between the third conductive line and the first semiconductor layer.

3. The semiconductor device of claim 1, wherein a sidewall of the conductive layer is substantially flush with a sidewall of the first conductive line.

4. The semiconductor device of claim 1, wherein a top surface of the memory layer is substantially coplanar with a top surface of the conductive layer, and a bottom surface of the memory layer is substantially coplanar with a bottom surface of the conductive line.

5. The semiconductor device of claim 1, wherein a sidewall of the memory layer is substantially flush with sidewalls of the first conductive line and the conductive layer.

6. The semiconductor device of claim 5, wherein the memory layer is in direct contact with the first semiconductor layer.

7. The semiconductor device of claim 1, wherein the first conductive line is in direct contact with the first semiconductor layer.

8. The semiconductor device of claim 1, wherein the conductive layer is in direct contact with the first semiconductor layer.

9. A semiconductor device, comprising:
   a plurality of first semiconductor layers, respectively extending along a first direction and stacked along a second direction substantially perpendicular to the first direction;
   a first gate, wrapping around the first semiconductor layers and extended along the second direction;
   a second gate, extending along the second direction; and
   a second semiconductor layer, extending along the second direction and between the second gate and the first semiconductor layers.

10. The semiconductor device of claim 9, wherein the first gate comprises a first gate electrode and a first gate dielectric layer between the first gate electrode and the first semiconductor layer.

11. The semiconductor device of claim 9, wherein the first gate is sheet-shaped.

12. The semiconductor device of claim 9, wherein the second gate comprises a second gate electrode and a second gate dielectric layer between the second gate electrode and the second semiconductor layer.

13. The semiconductor device of claim 9, further comprising a plurality of conductive layers extended along a third direction substantially perpendicular to the first and second directions, wherein one of the first semiconductor layers is disposed between the conductive layers.

14. The semiconductor device of claim 13, further comprising a dielectric layer between and in direct contact with the first semiconductor layer and the second semiconductor layer, wherein a sidewall of the dielectric layer is substantially flush with sidewalls of the conductive layer.

15. The semiconductor device of claim 9, wherein the second semiconductor layer surrounds the second gate.

16. The semiconductor device of claim 9, wherein the first gate is electrically connected to a write word line, and the second gate is electrically connected to a read word line.

17. A method of forming a semiconductor device, comprising:

forming a stack comprising a plurality of first semiconductor layers, a plurality of first dielectric layers, a plurality of first conductive layers and a plurality of second dielectric layers alternately stacked along a first direction;

forming a first gate to wrap around the stacked first semiconductor layers;

forming a second semiconductor layer at a first side of the stacked first semiconductor layers, wherein the second semiconductor layer extends along the first direction; and forming a second gate, wherein the second gate extends along the first direction and is surrounded by the second semiconductor layer.

18. The method of claim 17, further comprising:

forming a first opening to penetrate through the first semiconductor layers, the first dielectric layers, the first conductive layers and the second dielectric layers;

recessing the first conductive layers, to form a plurality of recesses;

forming a third dielectric layer to fill up the first opening and the recesses.

19. The method of claim 18, wherein forming the first gate comprises:

forming a second opening by removing portions of the first, second and third dielectric layers, to expose the stacked first semiconductor layers;

forming a gate dielectric layer on exposed surfaces of the first semiconductor layers; and forming a gate electrode to fill up the second opening.

20. The method of claim 17, after forming the first gate, further comprising:

removing portions of the first semiconductor layers, the first dielectric layers, the first conductive layers and the second dielectric layers, to form a first opening, to expose portions of the first semiconductor layers at the first side;

recessing the first semiconductor layers, to form a plurality of first recesses;

forming a plurality of dummy dielectric layers, to fill up the first recesses;

forming a third dielectric layer to fill up the first opening;

forming a second opening in the third dielectric layer, to expose the first conductive layers and the dummy dielectric layers;

removing the dummy dielectric layers, to form a plurality of second recesses; and forming a plurality of third dielectric layers in the first recesses respectively.

*   *   *   *   *